US008248567B2

(12) United States Patent
Kawamura et al.

(10) Patent No.: US 8,248,567 B2
(45) Date of Patent: Aug. 21, 2012

(54) DISPLAY DEVICE WITH DUMMY SIGNAL LINE HAVING A BEND

(75) Inventors: Tetsuya Kawamura, Mobara (JP); Kazuhiko Yanagawa, Mobara (JP); Nagatoshi Kurahashi, Mobara (JP); Tsuyoshi Uchida, Mobara (JP)

(73) Assignees: Hitachi Displays, Ltd., Chiba (JP); Panasonic Liquid Crystal Display Co., Ltd., Hyogo-ken (JP)

(*) Notice: Subject to any disclaimer, the term of this patent is extended or adjusted under 35 U.S.C. 154(b) by 0 days.

(21) Appl. No.: 13/230,051

(22) Filed: Sep. 12, 2011

(65) Prior Publication Data

US 2012/0026445 A1    Feb. 2, 2012

Related U.S. Application Data

(60) Continuation of application No. 12/331,553, filed on Dec. 10, 2008, now Pat. No. 8,045,123, which is a division of application No. 11/452,371, filed on Jun. 14, 2006, which is a division of application No. 10/390,910, filed on Mar. 19, 2003, now Pat. No. 7,064,734.

(30) Foreign Application Priority Data

Mar. 20, 2002 (JP) .................................. 2002-077678

(51) Int. Cl.
*G02F 1/1343* (2006.01)
*G02F 1/1345* (2006.01)

(52) U.S. Cl. ........ 349/149; 349/139; 349/145; 349/146; 349/152

(58) Field of Classification Search .................. 349/139, 349/145–156

See application file for complete search history.

(56) References Cited

U.S. PATENT DOCUMENTS

| 5,966,189 A | * | 10/1999 | Matsuo ........................... 349/38 |
| 6,043,859 A | | 3/2000 | Maeda |
| 6,201,346 B1 | | 3/2001 | Kusaka |
| 6,353,464 B1 | | 3/2002 | Noumi et al. |
| 6,359,606 B1 | | 3/2002 | Yudasaka |
| 6,433,767 B1 | | 8/2002 | Murade |
| 6,630,977 B1 | | 10/2003 | Yamazaki |
| 6,646,692 B2 | | 11/2003 | Yamazaki |
| 2002/0109652 A1 | * | 8/2002 | Lim et al. ......................... 345/87 |
| 2002/0159016 A1 | | 10/2002 | Nishida et al. |
| 2003/0103181 A1 | | 6/2003 | Imayama et al. |

FOREIGN PATENT DOCUMENTS

| JP | 9-297319 | 11/1997 |
| JP | 11-24094 | 1/1999 |
| JP | 11-142868 | 5/1999 |
| JP | 11-326933 | 11/1999 |
| JP | 2000-155335 | 6/2000 |
| JP | 2001-162634 | 6/2000 |
| JP | 2001-281703 | 10/2001 |
| JP | 2002-40482 | 2/2002 |

* cited by examiner

*Primary Examiner* — Lauren Nguyen
(74) *Attorney, Agent, or Firm* — Antonelli, Terry, Stout & Kraus, LLP.

(57) ABSTRACT

A display device includes a display drain signal line which belongs to a display pixel is connected to a pixel electrode via a TFT, a first dummy drain signal line which belongs to a dummy pixel is connected to a dummy pixel electrode via a TFT, and a second dummy drain signal line is disposed outside of the dummy pixel. The second dummy drain signal line is not connected to a dummy pixel electrode.

8 Claims, 30 Drawing Sheets

DISPLAY DEVICE WITH DUMMY SIGNAL LINE HAVING A BEND

CROSS REFERENCE TO RELATED APPLICATION

This application is a continuation application of U.S. application Ser. No. 12/331,553, filed Dec. 10, 2008, now U.S. Pat. No. 8,045,123, which is a divisional application of U.S. application Ser. No. 11/452,371, filed Jun. 14, 2006, which is a divisional application of U.S. application Ser. No. 10/390,910, filed Mar. 19, 2003, now U.S. Pat. No. 7,064,734, the contents of which are incorporated herein by reference.

BACKGROUND OF THE INVENTION

1. Field of the Invention

This invention relates to a display device, such as an in-plane switching (IPS) type liquid crystal display device or the like device.

2. Description of the Related Art

A liquid crystal display device of the so-called in-plane switching type has been so constituted that the substrates are arranged opposed to each other with the liquid crystals sandwiched therebetween, and pixel electrodes and counter electrodes that produce an electric field relative to the pixel electrodes are formed on the pixel region of one substrate on the side of the liquid crystals, and the liquid crystals are driven by components of the electric field which are nearly in parallel with the substrate.

In the device of the active matrix type to which the above constitution is adapted, the pixel regions are formed by those regions which are surrounded by a plurality of gate signal lines arranged in parallel on the surface of one substrate on the side of the liquid crystals and by a plurality of drain signal lines arranged so as to intersect the gate signal lines.

Each pixel region is provided with a thin-film transistor that is operated by a scanning signal from a gate signal line, the pixel electrode supplied with a video signal from a drain signal line through the thin-film transistor, and the counter electrode supplied with a signal that serves as a reference to the video signal.

Here, the pixel electrode and the counter electrode are formed as striped patterns extending in their respective directions. These electrodes are usually formed in a number of two or more and are alternately arranged.

There has also been known a constitution in which counter electrodes are formed on the upper surface of an insulating film formed covering the drain signal lines, the counter electrodes being formed along the drain signal lines and having center axes thereof which are nearly in agreement with the drain signal lines and further having a width greater than the width of the drain signal lines.

This enables the lines of electric force from the drain signal lines to be terminated at the counter electrodes instead of terminating at the pixel electrodes. The lines of electric force that terminate at the pixel electrodes turn out to be noises.

In order to decrease parasitic capacitance between the drain signal lines and the counter electrodes in this constitution, the structure has been known to interpose, at least, an organic material layer such as of a resin as an interlayer insulating film between them.

It has, however, been pointed out that the liquid crystal display device which is thus constituted permits the organic material layer to be easily peeled off from the edges thereof in the step of production, the organic material layer being peeled off up to the liquid crystal display unit to cause defective display.

An inquiring of the cause revealed the following facts. That is, when the electrodes are formed on the upper surface of the organic material layer, the end surfaces of the organic material layer are exposed to a resist-developing solution, a peeling solution and to an electrode-etching solution. These liquids for the resist-developing, the peeling and the electrode-etching are for removing the residue of the organic material layer. Among them, the developing solution is used for dissolving the uncured organic material layer itself, and the peeling solution is used for removing the photoresist itself of the organic material layer after it has played its role. These liquids have a tendency of peeling the organic films off and, hence, the countermeasure must be taken based upon this as a prerequisite.

SUMMARY OF THE INVENTION

This invention takes into account the above-mentioned circumstances, and has as an object to provide a display device avoiding the peeling of organic material layers.

Briefly described below are representative examples of the invention disclosed in this application.

According to a first embodiment of a display device of the present invention, there is provided, for example, a substrate having a display portion and a peripheral portion, a plurality of gate signal lines and a plurality of drain signal lines formed over the substrate, a plurality of switching elements connected to the plurality of gate signal lines and the plurality of drain signal lines and formed over the substrate, a plurality of pixel electrodes connected to the plurality of switching element and formed in the display portion, and a plurality of counter electrodes formed adjacent to the plurality of pixel electrodes in the display portion. An insulating film of an organic material layer is formed in the display portion and the peripheral portion, the plurality of pixel electrodes and the plurality of counter electrodes are stripe patterns and have a portion bent in one direction, and a plurality of dummy pixel electrodes and a plurality of dummy counter electrodes are formed in the peripheral portion.

According to a modification of the first embodiment of the present invention, for example, a number of at least either the plurality of dummy pixel electrodes or the plurality of dummy counter electrodes in each pixel region is greater than a number of the corresponding electrode in each pixel of the display portion.

According to a second embodiment of the present invention, there is provided for example, a substrate having a display portion and a peripheral portion, a plurality of gate signal lines and a plurality of drain signal lines formed over the substrate, a plurality of switching elements connected to the plurality of gate signal lines and the plurality of drain signal lines and formed over the substrate, and a plurality of pixel electrodes connected to the plurality of switching elements and formed in the display portion. An organic interlayer film is formed in the display portion and the peripheral portion, and an insulating film is formed between the substrate and the organic interlayer film in the display portion and the peripheral portion, and the insulating film comprises a plurality of recesses or a plurality of protuberances.

According to a modification of the second embodiment of the present invention, for example, the plurality of recesses or the plurality of protuberances are a plurality of openings formed in the insulating film.

According to another modification of the second embodiment of the present invention, for example, the plurality of openings are a plurality of holes in a scattered manner or a plurality of grooves in parallel.

According to a further modification of the second embodiment of the present invention, for example, the display device is a liquid crystal display device, and the insulating film is an inorganic insulating film.

According to a further modification of the second embodiment of the present invention, for example, the display device is an organic EL display device, and the organic interlayer film is a bank film of the organic EL display device.

According to another modification of the second embodiment of the present invention, there is provided for example, a material layer formed between the substrate and the insulating layer to form the plurality of recesses or the plurality of protuberances of the insulating film.

According to a further modification of the second embodiment of the present invention, for example, the material layer is made of a metal layer which is the same as the plurality of drain signal lines.

According to a third embodiment of the present invention, there is provided, for example, a substrate having a display portion and a peripheral portion, a plurality of gate signal lines and a plurality of drain signal lines formed over the substrate, a plurality of switching elements connected to the plurality of gate signal lines and the plurality of drain signal lines and formed over the substrate, and a plurality of pixel electrodes connected to the plurality of switching elements and formed in the display portion. An organic interlayer film is formed in the display portion and the peripheral portion, and a covering layer is formed on the organic interlayer film in the peripheral portion.

According to a modification of the third embodiment of the present invention, for example, the covering layer is formed on a portion of an end surface of the organic interlayer film in the peripheral portion.

According to another modification of the third embodiment of the present invention, for example, the covering layer is made of a transparent conductive material.

According to a further modification of the third embodiment of the present invention, for example, the covering layer is made of a material same as the plurality of pixel electrodes.

According to another modification of the third embodiment of the present invention, for example, the covering layer is made of a metal layer.

According to a further modification of the third embodiment of the present invention, for example, the covering layer is a testing terminal of the display device.

According to another modification of the third embodiment of the present invention, for example, the display device is an organic EL display device, and the organic interlayer film is a bank film of the organic EL display device.

According to another modification of the third embodiment of the present invention, for example, the covering layer is made of a material same as the plurality of pixel electrodes.

According to another modification of the third embodiment of the present invention, there is provided for example, a plurality of counter electrodes formed adjacent to the plurality of pixel electrode, and the covering layer is made of a material same as the plurality of counter electrode.

DESCRIPTION OF THE PREFERRED EMBODIMENTS

Embodiments of the display device according to the invention will now be described with reference to the drawings.
<Entire Constitution>

Figure 2A:
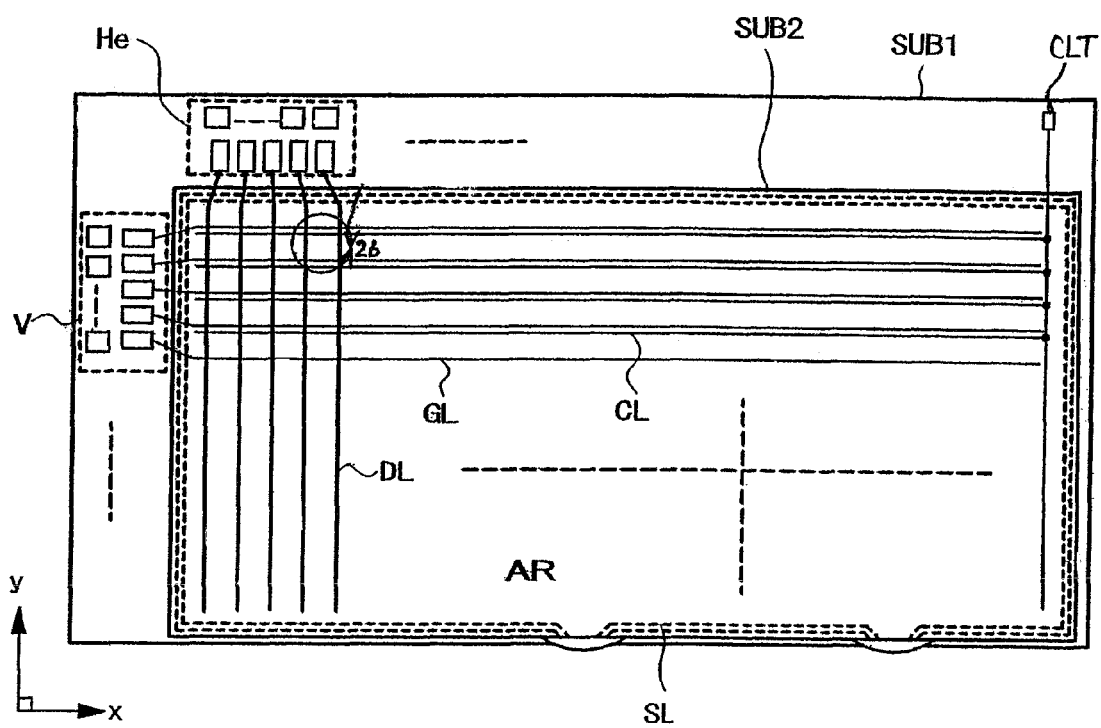
FIG. 2A is a view of an entire equivalent circuit of the display device according to the first embodiment of the invention.
Figure 2B:
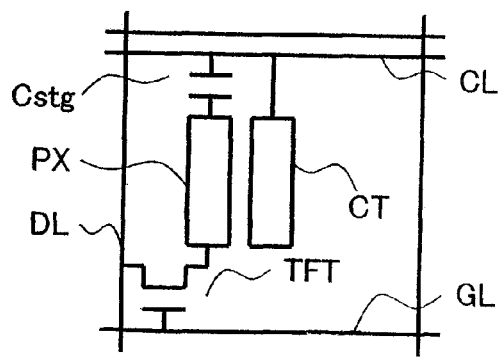
FIG. 2B is an enlarged circuit portion thereof.

FIG. 2A is a plan view illustrating the entire liquid crystal display device which is an embodiment of the display device of the invention. FIG. 2B shows an equivalent circuit of one pixel in the display device.

In FIG. 2A, a pair of transparent substrates SUB1 and SUB2 are arranged opposed to each other through liquid crystals which are sealed by a sealing member SL which also works to secure the transparent substrate SUB2 to the one transparent substrate SUB1.

On the surface of the transparent substrate SUB1 on the side of the liquid crystals sealed by the sealing member SL, there are formed gate signal lines GL extending in the x-direction and arranged in parallel in the y-direction, and drain signal lines DL extending in the y-direction and arranged in parallel in the x-direction.

The regions surrounded by the gate signal lines GL and by the drain signal lines DL constitute pixel regions. A set of these pixel regions in the form of a matrix constitute a liquid crystal display portion AR. In the pixel regions arranged in parallel in the x-direction, there are formed common counter voltage signal lines CL running through the pixel regions. The counter voltage signal lines CL are for supplying a voltage to the counter electrodes CT that will be described later in the pixel regions, the voltage serving as a reference to the video signals.

In each pixel region, there are formed a thin-film transistor TFT that is operated by a scanning signal from the gate signal line GL of one side and a pixel electrode PX which is supplied with a video signal from the drain signal line DL of one side through the thin-film transistor TFT. The pixel electrode PX generates an electric field relative to the counter electrode CT formed in common (connected to the counter voltage signal line) on the pixel regions on the surface of the transparent substrate SUB2 on the side of the liquid crystals. Relying upon this electric field, the light transmission factor of the liquid crystals is controlled.

The ends on one side of the gate signal lines GL extend beyond the sealing member SL, and constitute terminals to which are connected the output terminals of a vertical scanning drive circuit V. The input terminals of the vertical scanning drive circuit V receive signals from a printed board arranged on the outer side of the liquid crystal display panel. The vertical scanning drive circuit V is constituted by a plurality of semiconductor devices, the plurality of gate signal lines neighboring to each other being grouped, and the semiconductor device being assigned to each of the groups. Similarly, the ends on one side of the drain signal lines DL extend beyond the sealing member SL, and constitute terminals to which are connected the output terminals of a video signal drive circuit He. The input terminals of the video signal drive circuit He receive signals from a printed board arranged on the outer side of the liquid crystal display panel. The video signal drive circuit He, too, is constituted by a plurality of semiconductor devices, the plurality of drain signal lines neighboring to each other being grouped, and the semiconductor device being assigned to each of the groups.

The counter voltage signal lines CL are connected in common at an end on the right side in the drawing with the connection line extending beyond the sealing member SL and forming a terminal CLT at an extended end. A voltage that serves as a reference for the video signals is supplied from the terminal CLT.

Any one of the gate signal lines GL is successively selected by a scanning signal from the vertical scanning circuit V. The drain signal lines DL are supplied with video signals from the video signal drive circuit He at timings for selecting the gate signal lines GL.

In the above embodiment, the vertical scanning drive circuit V and the video signal drive circuit He are semiconductor devices mounted on the transparent substrate SUB1. They, however, may be semiconductor devices of the so-called tape carrier system connected spanning across, for example, the transparent substrate SUB1 and the printed board, or may be the ones formed of the semiconductor elements of polycrystalline silicon together with the wiring layer on the surface of the transparent substrate SUB1 when the semiconductor layer of the thin-film transistor TFT is constituted by polycrystalline silicon (p-Si).

Figure 3:
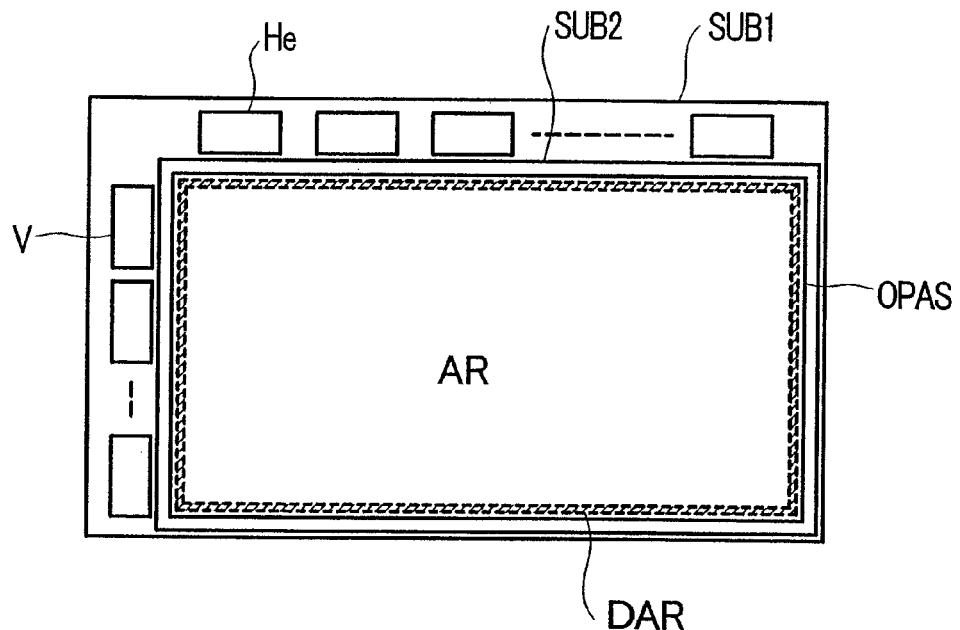
FIG. 3 is a plan view of the entire display device according to the first embodiment of the invention.

As shown in FIG. 3, which corresponds to FIG. 2, the thus formed liquid crystal display device has a display portion AR and a peripheral portion. In the peripheral portion, a dummy display portion DAR is formed as so-called dummy pixels in the pixel regions along the periphery of the display portion AR. In this specification and in the drawings, the liquid crystal display portion is denoted by AR and the dummy liquid crystal display portion is denoted by DAR.

The dummy pixels are constituted in the same manner as other pixels but do not contribute to producing the display. The dummy pixels same to make the value of the capacitor element Cstg in other pixels neighboring the dummy pixels equal to the value of the capacitor element Cstg in still other pixels neighboring to the other pixels. Therefore, it is sufficient if the dummy pixels are formed only in those portions that are arranged in parallel with the gate signal lines GL. In this embodiment, however, the dummy pixels are also formed in those portions that are arranged in parallel with the drain signal lines DL, thereby to form the dummy liquid crystal display portion DAR mentioned above.

<Constitution of Pixels>

Figure 1:
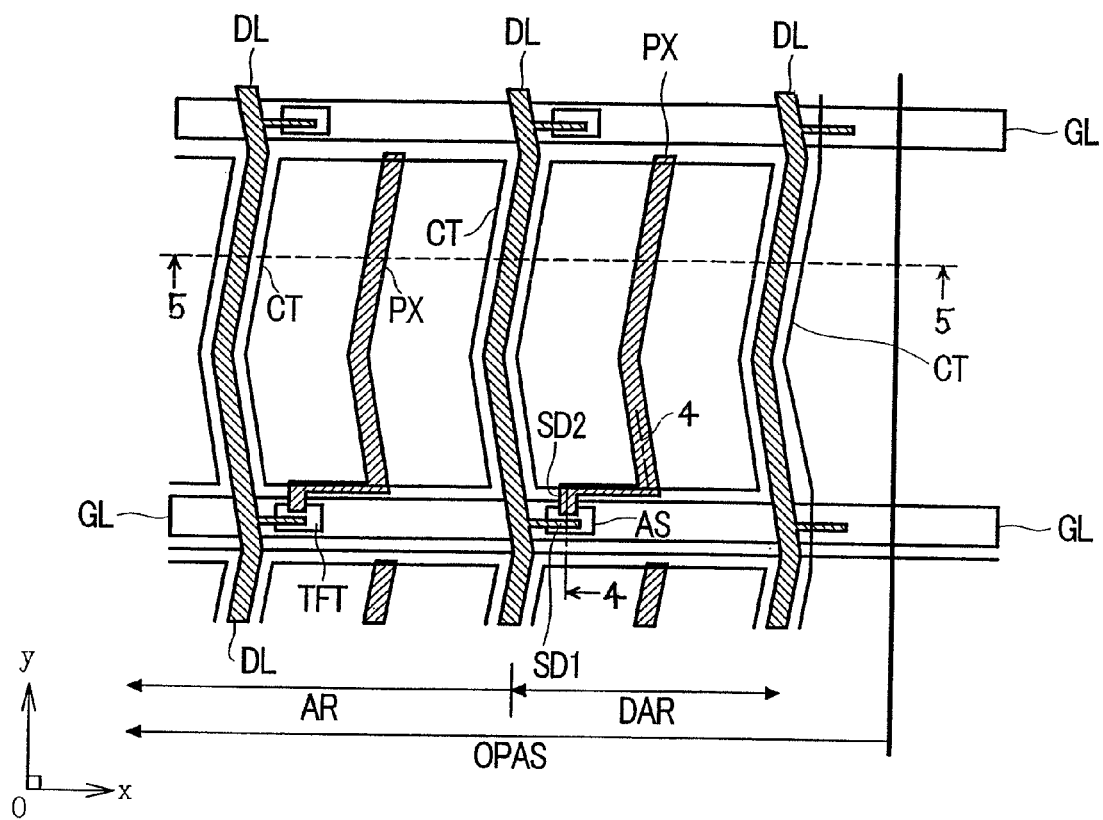
FIG. 1 is a plan view of pixels in a display device according to a first embodiment of the invention.

FIG. 1 is a plan view illustrating the above-mentioned dummy pixel and another pixel neighboring the dummy pixel according to an embodiment. Here, the dummy pixel is one of the dummy pixels arranged in parallel with the drain signal line DL.

Figure 4:
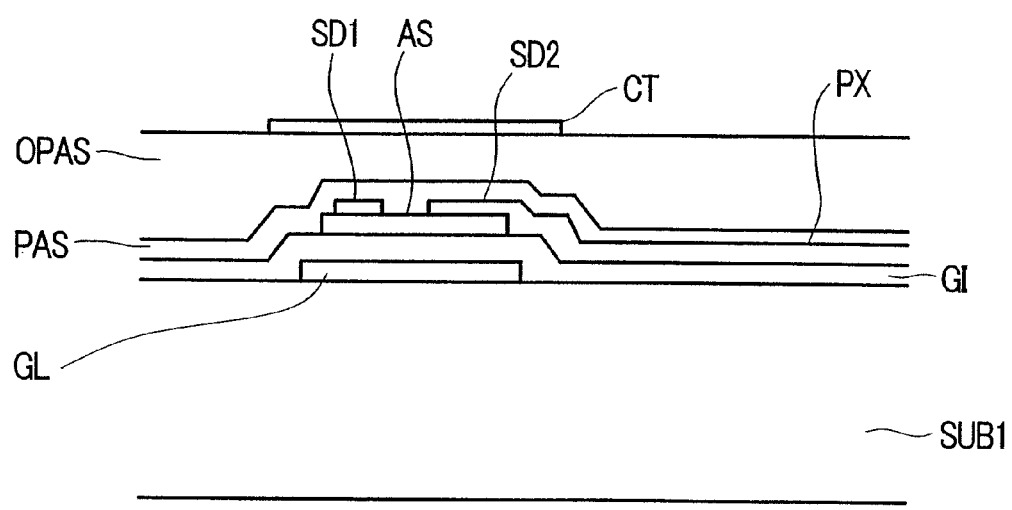
FIG. 4 is a sectional view taken along line 4-4 in FIG. 1.
Figure 5:
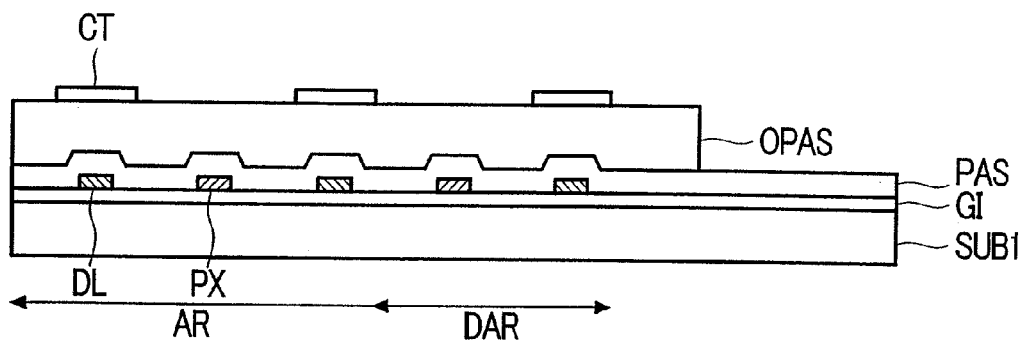
FIG. 5 is a sectional view taken along line 5-5 in FIG. 1.

FIG. 4 is a sectional view along the line 4-4 of FIG. 1, and FIG. 5 is a sectional view long the line 5-5 of FIG. 1. In these drawings, the gate signal lines GL are formed on the surface of the transparent substrate SUB1 on the side of the liquid crystals, the gate signal lines GL extending in the x-direction and being arranged in parallel in the y-direction. These gate signal lines GL surround rectangular regions together with the drain signal lines DL that will be described later, the regions constituting the pixel regions.

On the surface of the transparent substrate SUB1 on which the gate signal lines GL are formed, there is formed an insulating film GI of SiN so as to also cover the gate signal lines GL. The insulating film GI exhibits the function as an interlayer insulating film for the gate signal lines GL in the region where there are formed the drain signal lines DL that will be described later, and the function as a gate insulating film in the region where there are formed thin-film transistors TFT that will be described later.

A semiconductor layer AS of, for example, amorphous silicon is formed on the surface of the insulating film GI so as to be overlapped on portions of the gate signal lines GL. The semiconductor layer AS is that of the thin-film transistor TFT and has a drain electrode SD1 and a source electrode SD2 formed on the upper surface thereof, thereby to constitute a MIS (metal insulator semiconductor) transistor of an inverse stagger structure using part of the gate signal line as the gate electrode. Here, the drain electrode SD1 and the source electrode SD2 are simultaneously formed at the time of forming the drain signal line DL.

That is, there are formed drain signal lines DL extending in the y-direction and being arranged in the x-direction, the drain signal lines DL partly extending up to the upper surface of the semiconductor layer AS to thereby form drain electrodes SD1. There are further formed source electrodes SD2 being separated away from the drain electrodes SD1 by the channel length of the thin-film transistor TFT. Here, the drain signal lines DL have a plurality of bending portions in a direction in which they extend and are formed in a zig-zag shape. In this embodiment, the bending portions are formed, for example, in the portions where the gate signal line GL is formed, in the central portions of the pixel regions and in the portions where the next gate signal line GL is formed.

The source electrodes SD2 are formed integrally with the pixel electrodes PX that are formed in the pixel regions. Namely, the pixel electrodes PX serve as the source electrodes SD2 at the ends on one side thereof, and are constituted by electrodes which are extending in the y-direction nearly at the centers of the pixel regions. Further, the pixel electrodes are bent at the centers thereof and are formed in such a pattern that the drain signal lines DL are partly shifted in the x-direction.

A protection film is formed on the surface of the transparent substrate SUB1 on which are formed thin-film transistors TFT, drain signal lines DL, drain electrodes SD1, source electrodes SD2 and pixel electrodes PX. The protection film avoids the thin-film transistors TFT from coming into direct contact with the liquid crystals, and prevents the characteristics of the thin-film transistors TFT from being deteriorated. The protection film is constituted by a laminate of a protection film PAS formed of an inorganic material layer such as of SiN and a protection film OPAS formed of an organic material layer such as of a resin. In the drawing, the region where the protection film OPAS is formed is denoted by OPAS, which is the same also in other drawings. As described above, at least the organic material layer is used as the protection film in order to lower the dielectric constant of the protection film itself.

The counter electrodes CT are formed on the upper surface of the protection film OPAS. The counter electrodes CT are constituted by groups of a plurality of electrodes (two in the drawing) which are extending in the y-direction and are arranged in parallel in the x-direction. When viewed on a plane, these electrodes are positioned with the pixel electrode PX therebetween.

Here, the counter electrodes CT are formed in overlapping relationship on the drain signal lines DL with the center axes in agreement therewith, and having a width greater than the width of the drain signal lines DL. With the counter electrodes CT having a width greater than that of the drain signal lines DL, the lines of electric force from the drain signal lines DL are effectively prevented from terminating at the counter electrodes CT and terminating at the pixel electrodes PX. When the lines of electric force from the drain signal lines DL terminate at the pixel electrodes PX, there occurs noise. In this case, since the protection film OPAS having a small dielectric constant is interposed between the counter electrodes CT and the drain signal lines DL, it is allowed to decrease the parasitic capacitance therebetween.

The counter electrodes CT constituted by groups of electrodes are formed integrally with the counter voltage signal lines CL which are formed to fully cover the gate signal lines GL and are formed of the same material, and are supplied with a reference voltage through the counter voltage signal lines CL. The counter voltage signal lines CL which fully cover the gate signal lines GL have the ends on the other side of the pixel electrodes PX positioned thereunder in the portions that are deviated beyond the gate signal lines GL and, whereby, capacitor elements Cstg are formed between the pixel electrodes PX and the counter voltage signal lines CL with protection films PAS and OPAS as dielectric films. The capacity elements Cstg work to store the video signals fed to, for example, the pixel electrodes PX for relatively extended periods of time.

An orientation film (not shown) is formed on the upper surface of the transparent substrate SUB1 on which the counter electrodes CT are formed covering the counter electrodes CT. The orientation film is the one that comes in direct contact with the liquid crystals, and determines the direction of the initial orientation of molecules of the liquid crystals depending upon the rubbing formed on the surface thereof.

Even if the protection film OPAS may happen to peel off starting from the end thereof in the thus constituted liquid crystal display device, the peeling ceases to proceed in the region of the dummy liquid crystal display portion DAR and is prevented from advancing to the liquid crystal display portion AR inside the dummy liquid crystal display portion DAR.

Here, the drain signal lines DL, dummy counter electrodes CT and dummy pixel electrodes PX have been formed in a zig-zag pattern in the dummy liquid crystal display portion DAR. Therefore, the peeling force of the protection film OPAS is relaxed, and the protection film OPAS is prevented from being peeled off over a wide area at one time.

In this constitution, further, if there is maintained such a relationship that thickness of the protection film OPAS>thickness of the protection film PAS>thickness of the electrodes under the protection film PAS, then, the thickness of the electrodes under the protection film appears on the surface of the protection film, and the contact area increases. This enhances the adhesion to the lower layer of the organic film OPAS decreasing the chances of peeling.

Embodiment 2

Figure 6:
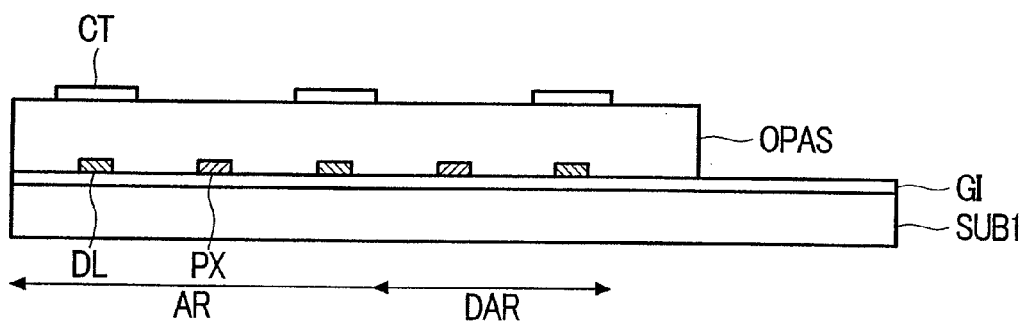
FIG. 6 is a sectional view of the display device according to a second embodiment of the invention.

FIG. 6 is a sectional view illustrating another embodiment of the liquid crystal display device of the invention and corresponds to FIG. 5. This embodiment differs from FIG. 5 in that use is made of the protection film OPAS of the organic material layer only without using the protection film PAS of the inorganic material layer. In this case, too, the same effect is obtained as a matter of course.

Embodiment 3

Figure 7:
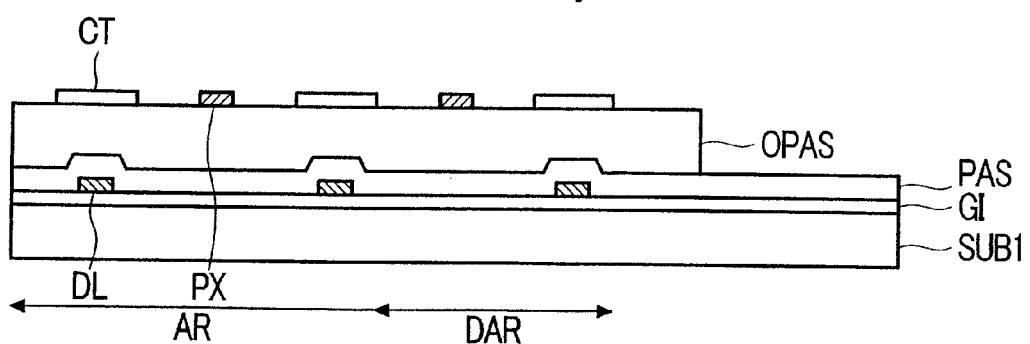
FIG. 7 is a sectional view of the display device according to a third embodiment of the invention.

FIG. 7 is a sectional view illustrating a further embodiment of the liquid crystal display device of the invention and corresponds to FIG. 5. This embodiment differs from FIG. 5 in that the pixel electrodes PX are formed on the upper surface of the protection film OPAS like the counter electrodes CT. The contact between the pixel electrodes PX and the source electrodes SD2 of the thin-film transistors TFT is accomplished using through-holes formed in the protection film OPAS. In this case, too, the same effect is obtained as a matter of course.

Embodiment 4

Figure 8A:
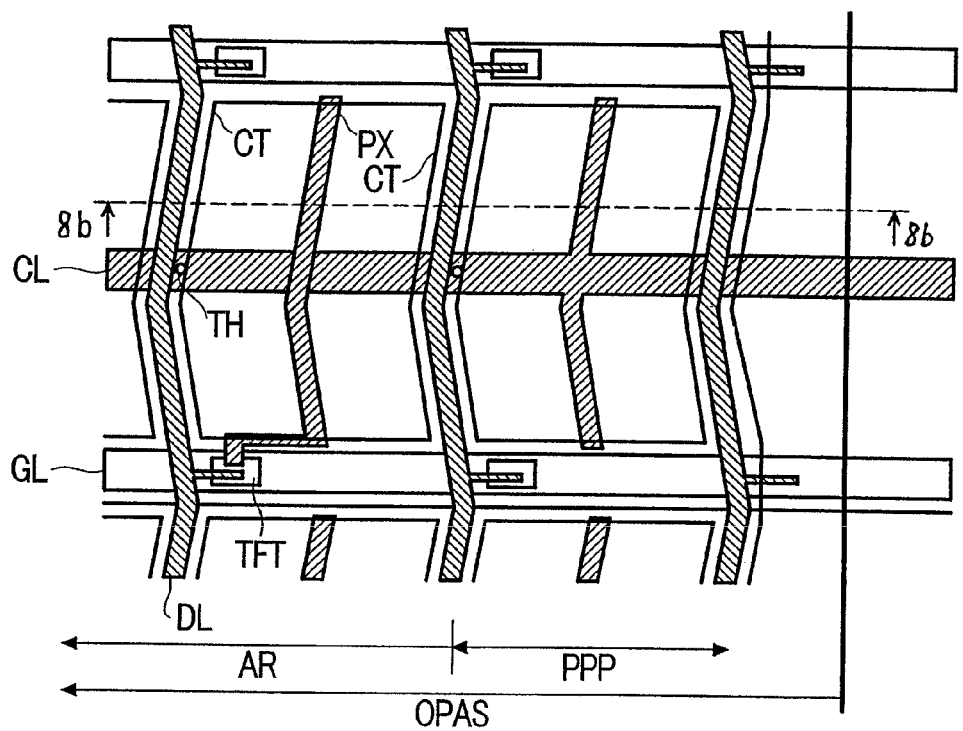
FIG. 8A is a plan view of the arrangement of pixels in the display device according to a fourth embodiment of the invention.
Figure 8B:
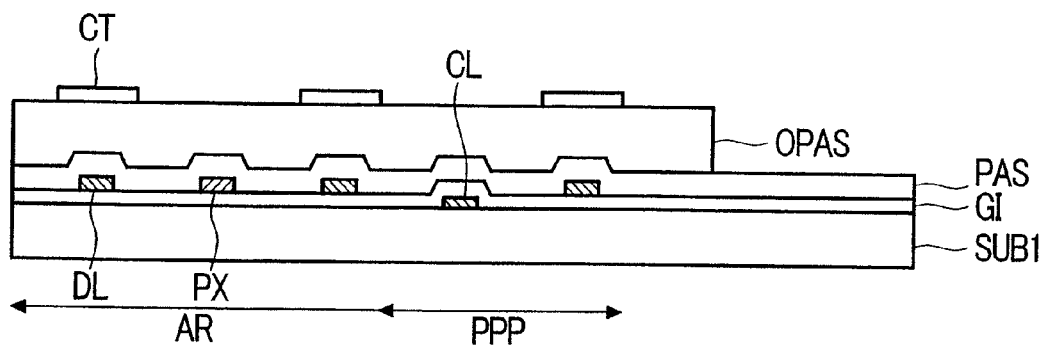
FIG. 8B is a sectional view taken along line 8b-8b in FIG. 8A.

FIG. 8A is a plan view illustrating a further embodiment of the liquid crystal display device of the invention, and corresponds to FIG. 1. FIG. 8B is a sectional view along the line 8b-8b of FIG. 8A. This embodiment differs from FIG. 5 in that the pixels in the dummy liquid crystal display portion DAR are simply formed as a pattern PPP for preventing the peeling of the protection film OPAS instead of being formed as dummy pixels, the pattern closely resembling that of the pixels. Hereinafter, the region forming the peel-preventing pattern is denoted as PPP.

Namely, in the liquid crystal display portions AR and PPP, there is formed the counter voltage signal line CL in common for the pixels that are arranged in the x-direction in the same layer as the gate signal line GL, the counter voltage signal line CT being connected to the counter electrodes CT in the ordinary pixels (pixels in the effective display region) via through-holes TH formed penetrating through the protection films OPAS and PAS. This makes it possible to lower the over-all electric resistance of the counter electrodes CT formed of, for example, a light-transmitting material.

In the portions which closely resemble the pixels in the liquid crystal display portion formed as the peel-preventing pattern, the counter voltage signal line CL is integrally formed with the counter electrodes CT. Namely, in these portions, the counter electrodes CT are formed to substitute for the pixel electrodes PX.

In this case, too, there is exhibited the same effect as that of the case of Embodiment 1. When thus constituted, it is allowed to greatly decrease the voltage differential in the portions closely resembling the pixels in the liquid crystal display portion DAR formed as the peel-preventing pattern and, hence, to suppress the occurrence of the so-called electrolytic corrosion. This also makes it possible to avoid the peeling of the protection film OPAS caused by the electrolytic corrosion when the device is really used.

Embodiment 5

Figure 9:
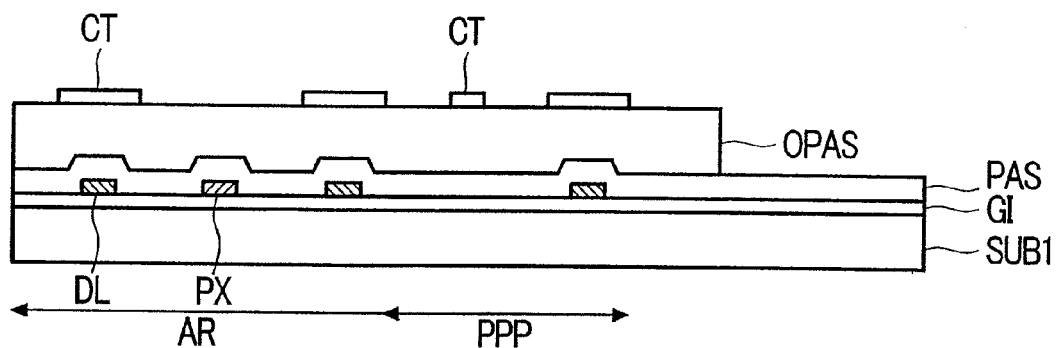
FIG. 9 is a sectional view of the display device according to a fifth embodiment of the invention.

FIG. 9 is a sectional view illustrating a further embodiment of the liquid crystal display device of the invention, and corresponds to FIG. 8B. This embodiment differs from that of FIG. 8B in that the other counter electrodes CT are formed separately as well as the counter electrodes CT that are formed on the protection film OPAS instead of forming the counter voltage signal line CL in the portions closely resembling the pixels in the peel-preventing pattern region PPP. There are exhibited the same effects as those of the embodiment 4.

Embodiment 6

Figure 10A:
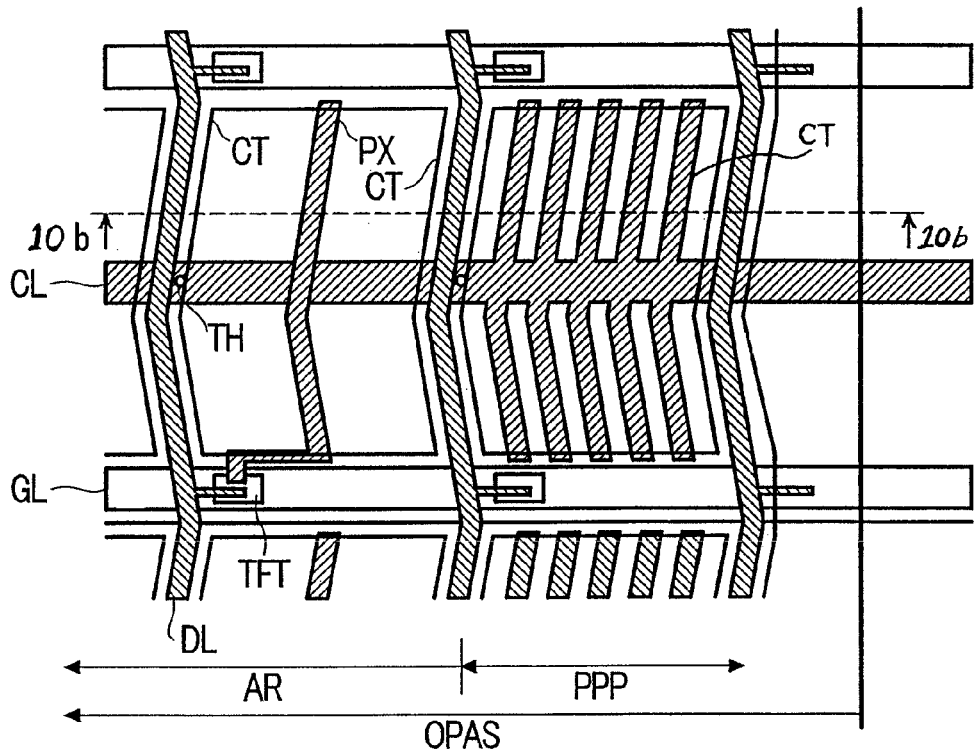
FIG. 10A is a plan view of the arrangement of pixels in the display device according to a sixth embodiment of the invention.
Figure 10B:
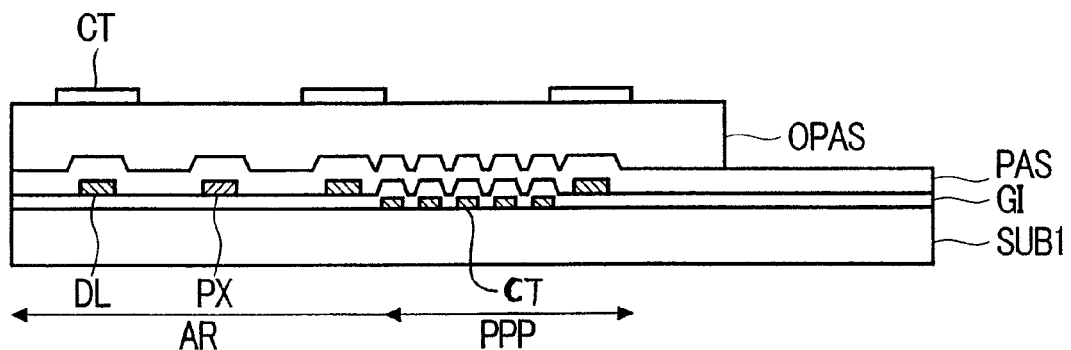
FIG. 10B is a sectional view taken along line 10b-10b in FIG. 10A.

FIG. 10A is a sectional view illustrating a further embodiment of the liquid crystal display device of the invention, and corresponds to FIG. 8. FIG. 10B is a sectional view along the line 10b-10b of FIG. 10A. This embodiment differs from that of FIG. 8 in that a plurality of the counter electrodes CT are formed integrally with the counter voltage signal line CL in the portions closely resembling the pixels in the peel-preventing pattern. Namely, the protection film OPAS is formed on the surface of the protection film PAS that is forming a step of the counter electrodes CT, and the adhering strength is improved.

Embodiment 7

Figure 11A:
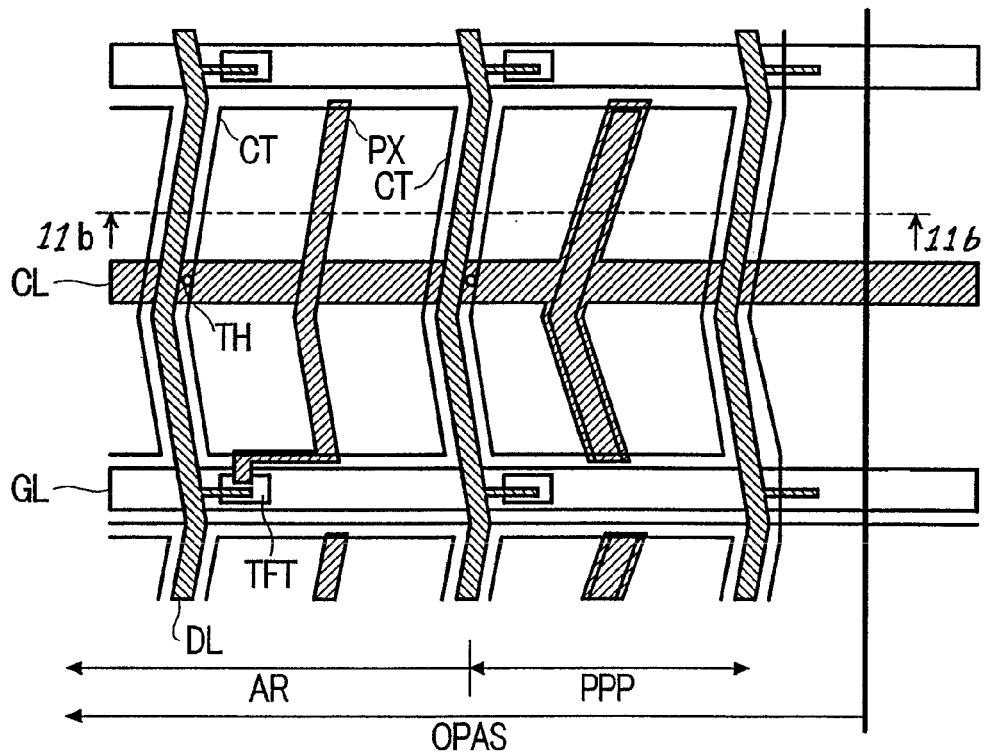
FIG. 11A is a plan view of the arrangement of pixels in the display device according to a seventh embodiment of the invention.
Figure 11B:
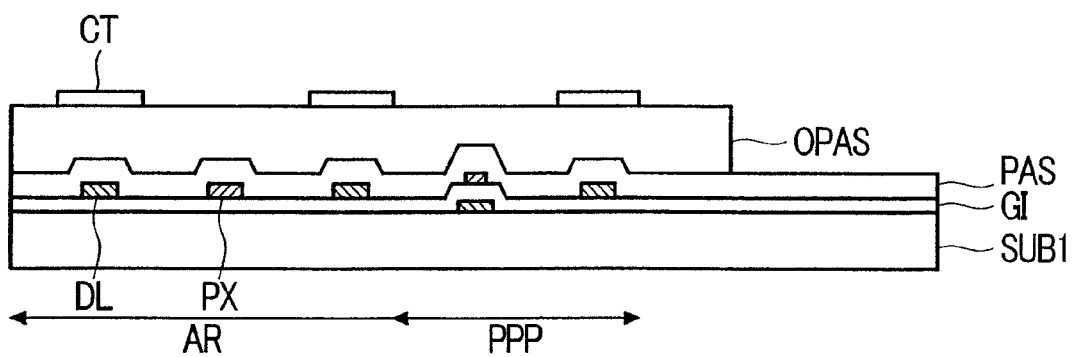
FIG. 11B is a sectional view taken along line 11b-11b in FIG. 11A.

FIG. 11A is a view illustrating the constitution of a further embodiment of the liquid crystal display device of the invention, and corresponds to FIG. 8A. FIG. 11B is a sectional view along the line 11b-11b of FIG. 11A, and corresponds to FIG. 8B. This embodiment differs from that of FIG. 8B in that a material layer is formed on the upper surface of the insulating film GI so as to be overlapped on the counter electrodes CT of the lower layer in the portions closely resembling the pixels in the peel-preventing pattern region PPP. Here, the material layer is simultaneously formed at the time of forming the drain signal lines DL, and renders the steps (recesses and protuberances) formed thereby to appear conspicuously on the surface of the protection film PAS. This makes it possible to terminate the peeling from the end surface of the protection film OPAS at this portion, and prevents the peeling from substantially reaching the liquid crystal display portion AR.

Embodiment 8

Figure 12:
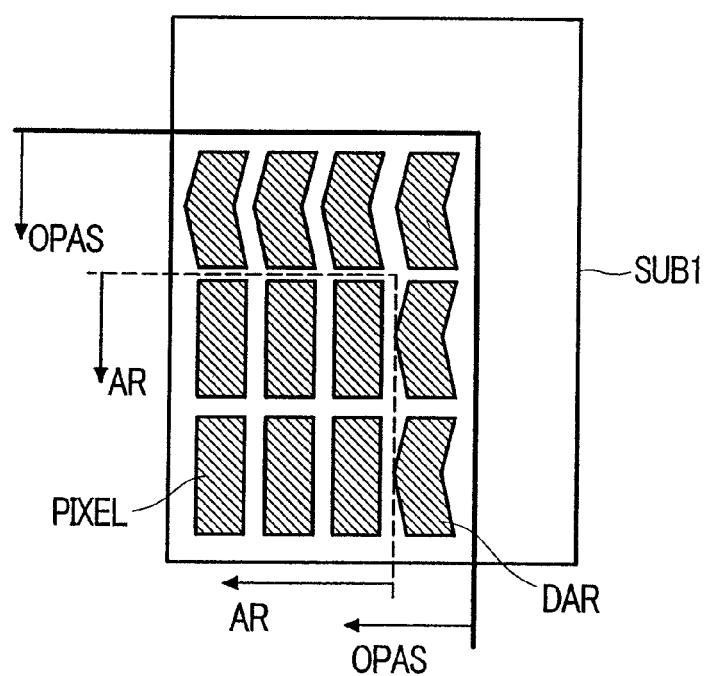
FIG. 12 is a plan view of the pixels in a corner portion of the display device according to a eighth embodiment of the invention.

FIG. 12 is a view illustrating a further embodiment of the liquid crystal display device according to the invention, i.e., is a plan view illustrating a right upper corner portion of the liquid crystal display portion AR.

In the embodiments described above, the drain signal lines DL, pixel electrodes PX and counter electrodes CT were formed in a zig-zag manner substantially in the pixel regions in the liquid crystal display portion AR. They, however, may be formed straight. In FIG. 12 in which the pixels are denoted by PIXEL, the signal lines in the pixels are formed straight. The object can be accomplished if the drain signal lines DL, pixel electrodes PX and counter electrodes CT are formed in a zig-zag shape in only those portions corresponding to the dummy liquid crystal display portion DAR.

Embodiment 9

Figure 13A:
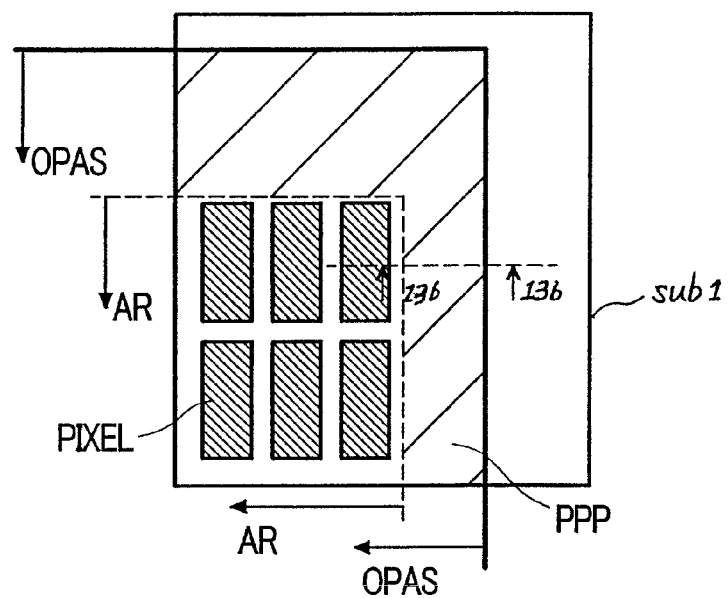
FIG. 13A is a view of the arrangement of the display device according to a ninth embodiment of the invention.
Figure 13B:
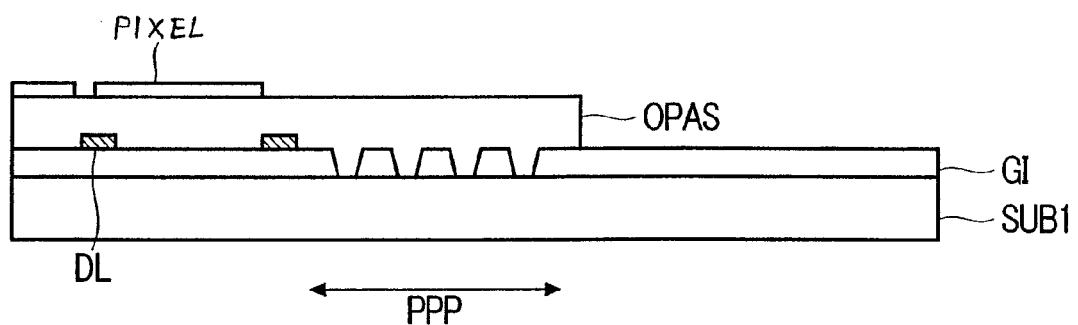
FIG. 13B is a sectional view taken along line 13b-13b in FIG. 13A.

FIG. 13A is a plan view illustrating part of the liquid crystal display device according to a further embodiment of the invention, and FIG. 13B is a sectional view along the line 13b-13b in FIG. 13A.

Substantially in the periphery of the liquid crystal display portion AR, there is no pattern which nearly resembles the pattern in the pixel regions substantially in the liquid crystal display portion AR. Instead, openings are formed in a scattered manner or arranged in parallel in the insulating film GI of these portions. These openings may be in the shape of holes or grooves. Thus, a number of recesses and protuberances are formed on the surface of the insulating film GI to reinforce the adhering force to the protection film OPAS formed on the surface thereof, so that it will not be peeled off.

Embodiment 10

Figure 14:
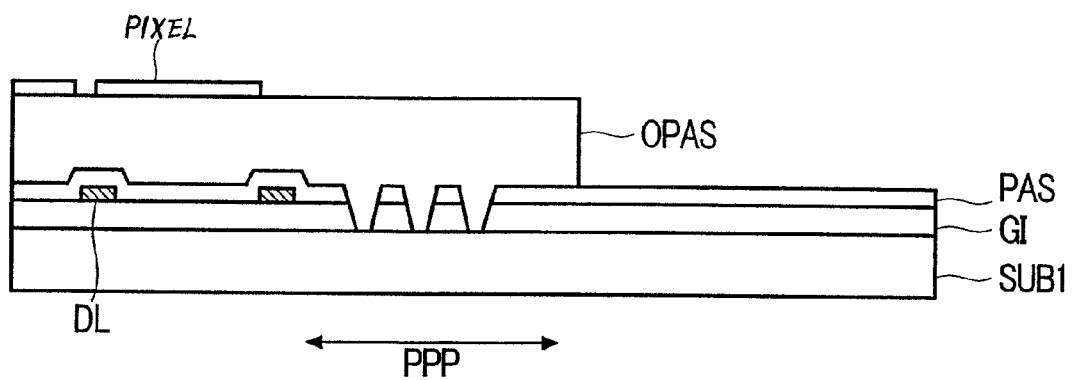
FIG. 14 is a sectional view of the display device according to a tenth embodiment of the invention.

FIG. 14 is a sectional view illustrating a further embodiment of the liquid crystal display device of the invention, and corresponds to FIG. 13B. This embodiment differs from that of FIG. 13B in that the protection film PAS is formed on the upper surface of the insulating film GI, and openings are formed in a scattered manner or in parallel in the protection film PAS as well as in the insulating film GI. In this case, too, there are exhibited the same effects as those of the embodiment 9.

Embodiment 11

Figure 15:
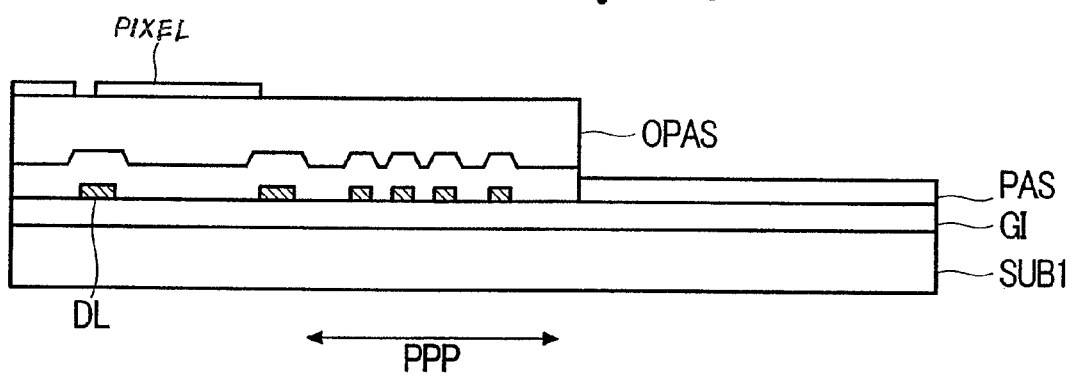
FIG. 15 is a sectional view of the display device according to an eleventh embodiment of the invention.

FIG. 15 is a sectional view illustrating a further embodiment of the liquid crystal display device of the invention, and corresponds to FIG. 14. This embodiment differs from that of FIG. 14 in that the opening is formed in neither the insulating film GI nor the protection film PAS but, instead, a number of material layers are formed in a scattered manner or being arranged in parallel on the surface of the insulating film GI in order to form recesses and protuberances in the peel-prevent pattern region PPP. In the case of this embodiment, the material layers are formed simultaneously with the formation of, for example, the drain signal lines DL.

Figure 16C:
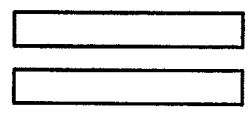
FIG. 16A to FIG. 16F are views of material layers of the display device according to the eleventh embodiment of the invention.
Figure 16F:
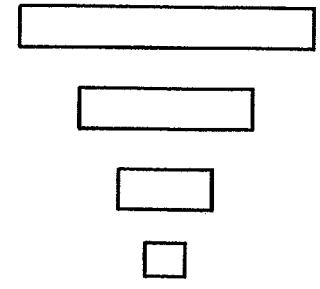
Figure 16B:
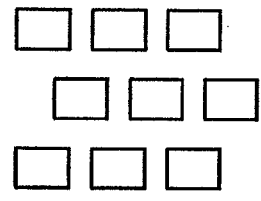
Figure 16E:
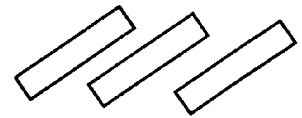
Figure 16A:
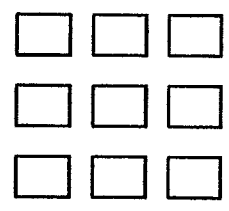
Figure 16D:
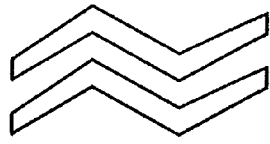

FIGS. 16A to 16F illustrate examples of patterns of many material layers arranged in a scattered manner or in parallel according to the embodiment 11. FIG. 16A shows a pattern forming a plurality of protuberances and recesses, FIG. 16B shows a pattern in which the protuberances and recesses are formed in a deviated manner, FIG. 16C shows a pattern of slits or stripes, FIG. 16D shows a pattern of slits or stripes that are bent, FIG. 16E shows a pattern in which a plurality of slits are formed in an inclined manner, and FIG. 16F shows a pattern in which the sizes of protuberances and recesses gradually differ.

Embodiment 12

Figure 17A:
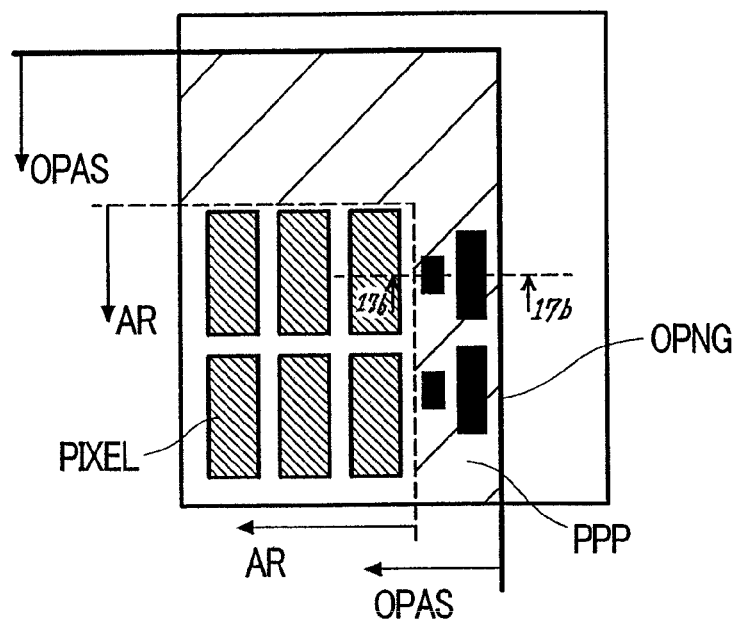
FIG. 17A is a view of the arrangement of the display device according to a twelfth embodiment of the invention.
Figure 17B:
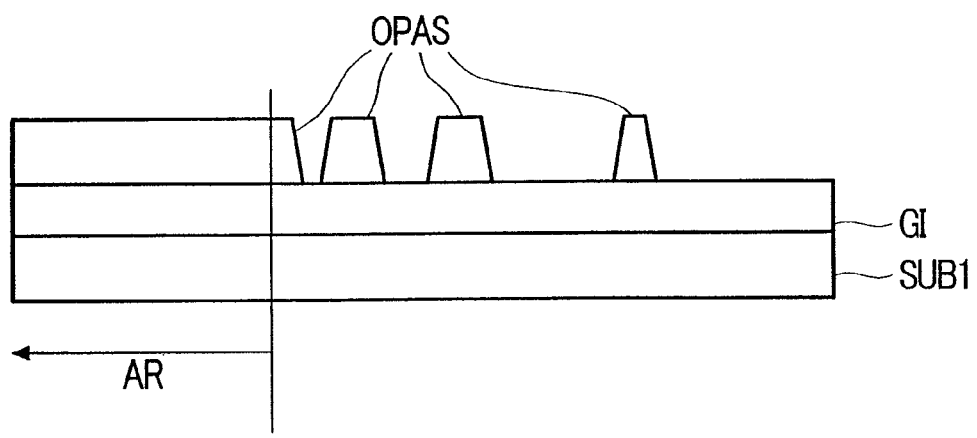
FIG. 17B is a sectional view taken along line 17b-17b in FIG. 17A.

FIG. 17A is a view of the constitution of a further embodiment of the liquid crystal display device of the invention, and corresponds to FIG. 13A. FIG. 17B is a sectional view along the line 17b-17b in FIG. 17A. This embodiment differs from that of FIG. 13A and FIG. 13B in that openings are formed in the protection film OPAS itself to prevent the protection film OPAS from being peeled off. In this case, the openings OPNG are formed in a plural number from the end of the protection film OPAS toward the side of the liquid crystal display portion AR, the openings near the end of the protection film OPAS being greater than the openings on the side of the liquid crystal display portion AR. This makes it possible to prevent the protection film OPAS from being peeled off at one time. Here, the openings have different sizes as described above so as to cope with the peeling force that may be produced in case the protection film OPAS is being peeled off.

Embodiment 13

Figure 18:
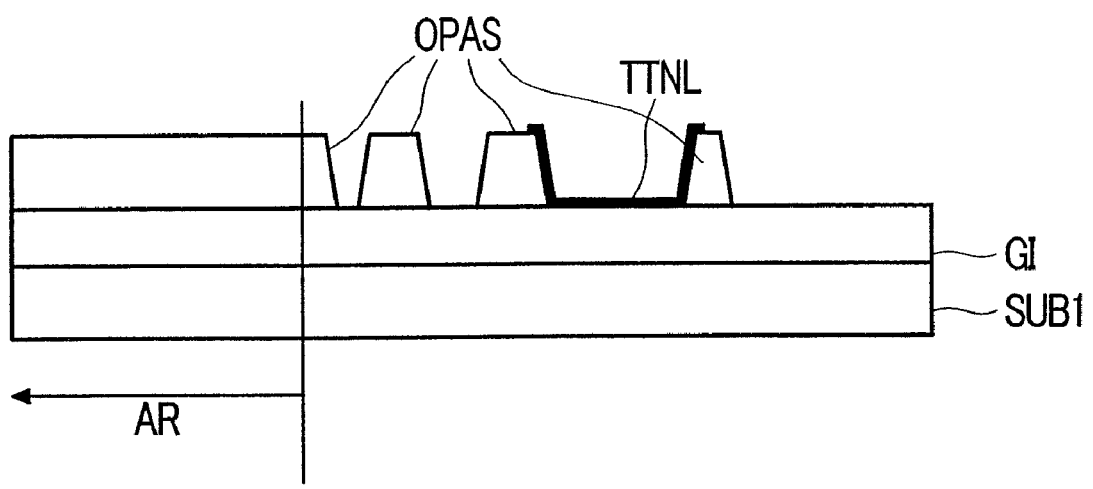
FIG. 18 is a sectional of the display device according to a thirteenth embodiment of the invention.

FIG. 18 is a view illustrating the constitution of a further embodiment of the liquid crystal display device of the invention, and corresponds to FIG. 17B. This embodiment differs from that of FIG. 17 in that a check terminal TTNL is formed in the region of opening formed in the protection film OPAS covering the opening. Here, the check terminal is the one for checking the breakage of the drain signal line DL or the gate signal line GL in the step of producing the liquid crystal display device, and is often cut away from the drain signal line DL or the gate signal line GL before the liquid crystal display device is finished. Covering the material of the check terminal prevents such an occurrence that various solutions infiltrate through the openings formed in the protection film OPAS to promote the peeling of the protection film OPAS.

Embodiment 14

Figure 19A:
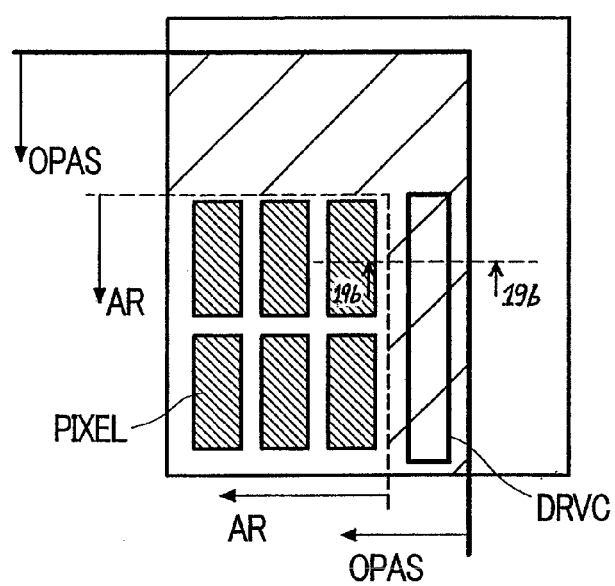
FIG. 19A is a view of the arrangement of the display device according to a fourteenth embodiment of the invention.
Figure 19B:
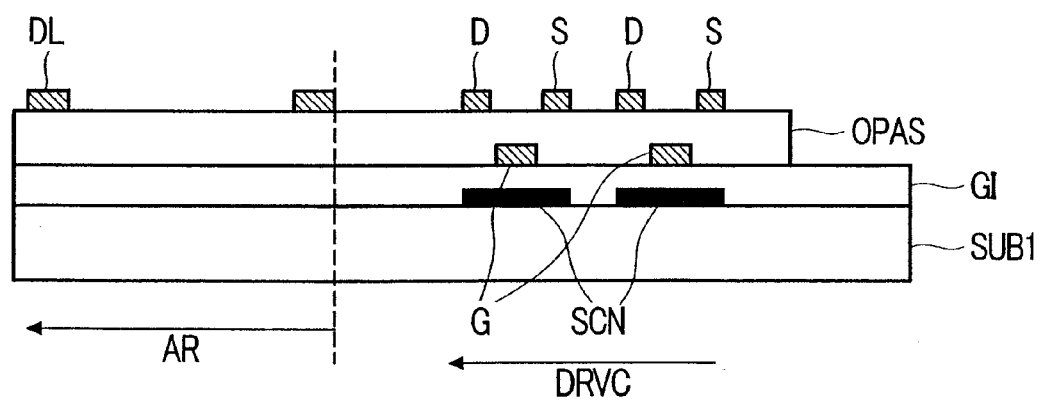
FIG. 19B is a sectional view taken along line 19b-19b in FIG. 19A.

FIG. 19A is a plan view illustrating a further embodiment of the liquid crystal display device of the invention. FIG. 19B is a sectional view along the line 19b-19b of FIG. 19A.

In this embodiment, a drive circuit DRVC is formed in a portion of the region substantially surrounding the liquid crystal display portion AR. The drive circuit is a scanning signal drive circuit V or a video signal drive circuit He, and is fabricated by directly forming thin-film transistors and a wiring layer for connecting them on the transparent substrate SUB1. As the semiconductor material SCN of the thin-film transistors, there is used polysilicon, polycrystalline silicon, continuous grain boundary silicon or CGS. If these circuits are formed under the protection film OPAS, complex ruggedness on the surfaces of the circuits contributes to improving the adhesion of the protection film OPAS and preventing the peeling.

Embodiment 15

Figure 20:
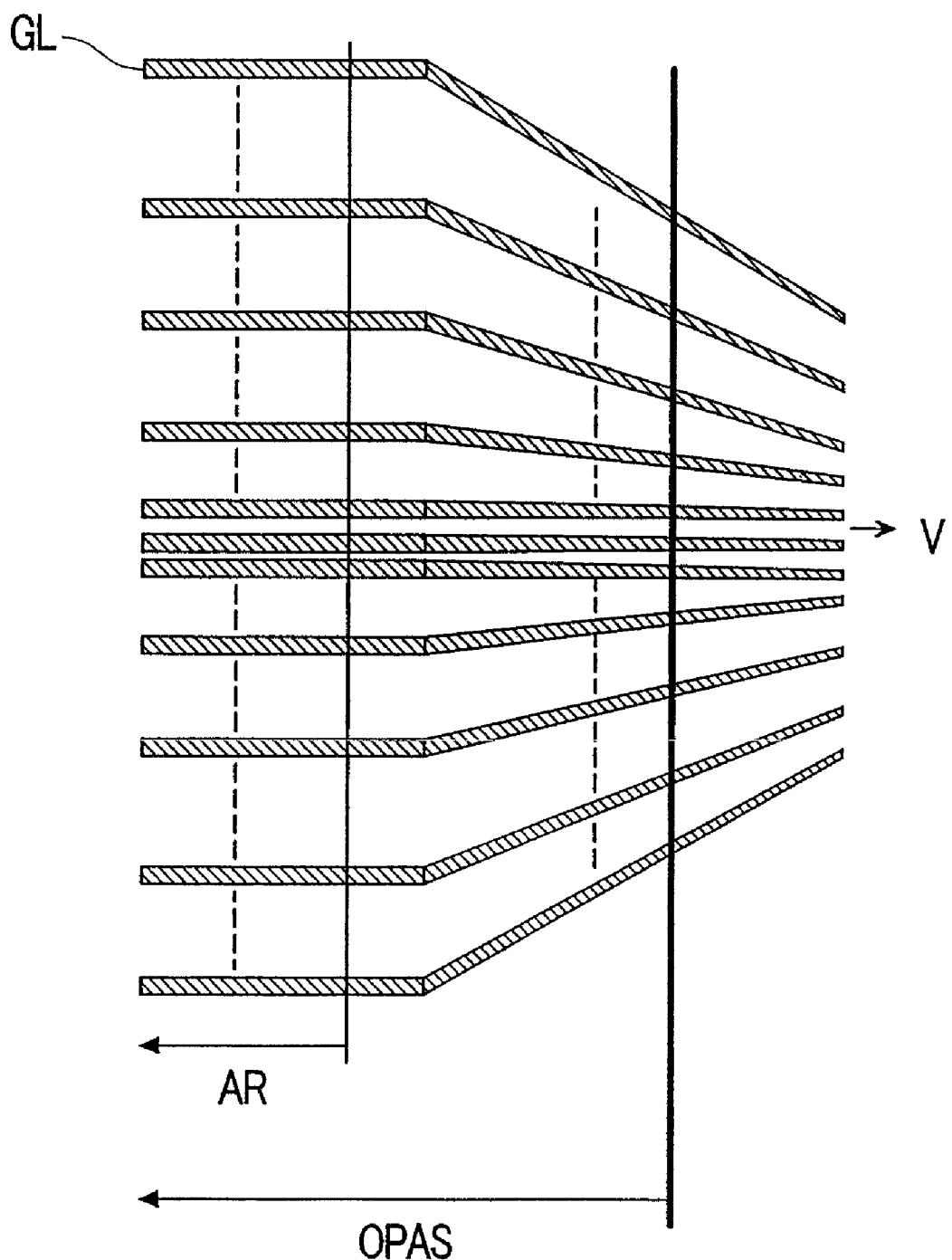
FIG. 20 is a plan view of the display device according to a fifteenth embodiment of the invention.
Figures 21A, 21B, 21C:
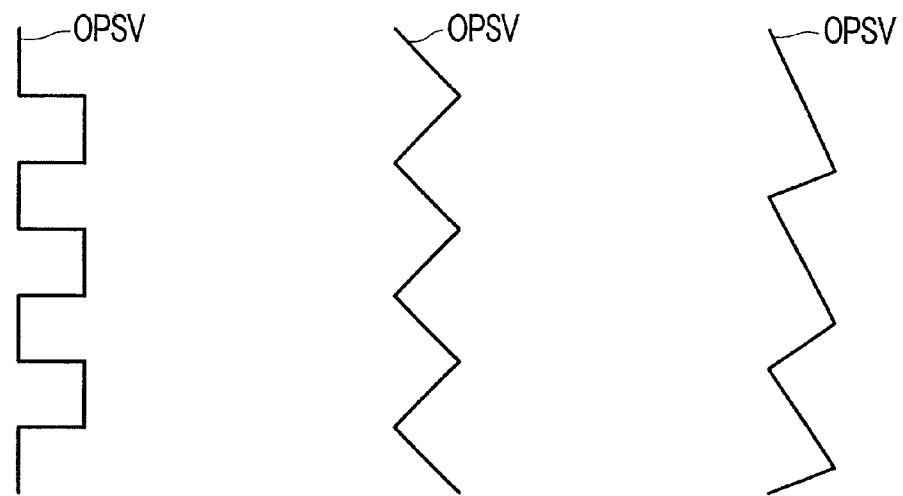
FIG. 21A to FIG. 21E are views of edge shapes of the display device according to a sixteenth embodiment of the invention.
Figures 21D, 21E:
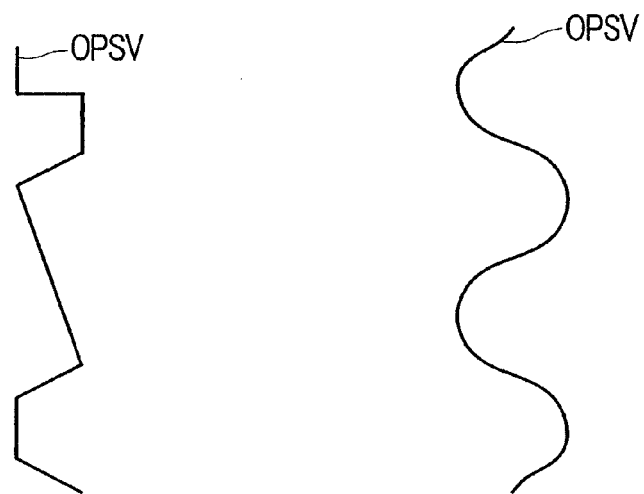

FIG. 20 is a plan view illustrating a further embodiment of the liquid crystal display device of the invention. FIG. 20 illustrates a portion where the gate signal lines GL are connected to the scanning signal drive circuit V. The bump gap for connecting the scanning signal drive circuit V to the gate signal lines GL is smaller than the gap among the gate signal lines GL neighboring to one another. Therefore, there exists a portion where the gate signal lines GL converge to the scanning signal drive circuit V.

In this embodiment, the edge of the protection film OPAS is so arranged as to traverse the portion where the gate signal lines GL converge. In this case, some of the gate signal lines GL run aslant with respect to the edge of the protection film OPAS. Because of this reason, the protection film OPAS is unlikely to peel off starting from the edge.

This embodiment has been described in relation to the portion where the gate signal lines GL are connected to the scanning signal drive circuit V. The same constitution may be employed even for a portion where the drain signal lines DL are connected to the video signal drive circuit He. Besides, the two constitutions may be used in combination, as a matter of course.

Embodiment 16

FIG. 21A to FIG. 21E are plan views illustrating a further embodiment of the liquid crystal display device of the invention. FIG. 21A to FIG. 21E show the edge of the protection film OPAS. The edge has a rugged shape in FIG. 21A, the edge has a zig-zag shape in FIG. 21B, the edge has a deformed zig-zag shape in FIG. 21C, the edge having a random shape in FIG. 21D, and the edge has a curved shape in FIG. 21E.

In these cases, too, the protection film OPAS can be prevented from being peeled off starting from the edge. Therefore, the protection film OPAS may be formed alone or may be formed in combination with the above-mentioned embodiments.

The effect increases with a decrease in the period of the repetitive pattern that is shown in FIG. 21. Concretely speaking, it is desired that a period consists of from one pixel to several pixels.

Embodiment 17

Figure 22:
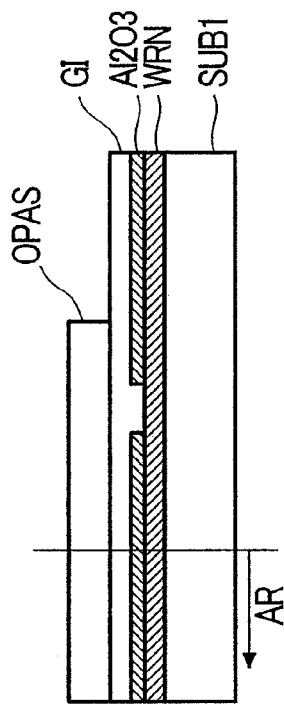
FIG. 22 is a sectional view of the display device according to a seventeenth embodiment of the invention.

FIG. 22 is a sectional view illustrating a further embodiment of the liquid crystal display device of the invention. FIG. 22 shows the edge of the protection film OPAS.

In FIG. 22, the wiring WRN constituting the gate signal line GL or the drain signal line DL is formed of aluminum (Al) or an alloy containing aluminum, and a protection film OPAS of an organic material layer is formed on the upper surface of the inorganic film (insulating film GI, or a laminate of the insulating film GI and the protection film PAS of the inorganic material layer). Openings are formed in the inorganic film for exposing portions of the gate signal lines GL or the drain signal lines DL in the peripheries of the region which substantially works as the liquid crystal display portion AR, the openings being covered with the protection film OPAS. When thus constituted, so-called hillocks develop from the gate signal line GL or the drain signal line DL in the region where the opening is formed in the inorganic film, the hillocks growing to a degree long enough to arrive at the protection film OPAS. Due to the hillocks, therefore, the protection film OPAS is prevented from peeling off.

Embodiment 18

Figure 23:
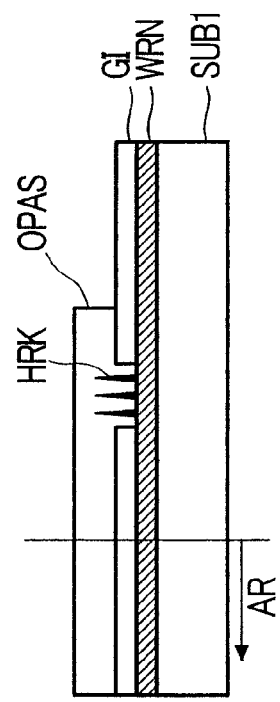
FIG. 23 is a sectional view of the display device according to an eighteenth embodiment of the invention.

FIG. 23 is a view illustrating the constitution of a further embodiment of the liquid crystal display device of the invention, and corresponds to FIG. 22. This embodiment differs from that of FIG. 22 in that the wiring WRN formed of aluminum (Al) or an alloy containing aluminum and constituting the gate signal line GL or the drain signal line DL, is covered with a metal layer WRN2 which is formed on the aluminum-containing wiring WRN to protect the wiring WRN from the hillocks. Openings are formed in the metal layer WRN2 as well as in the inorganic film GI, in the peripheries of the region which substantially works as the liquid crystal display portion AR.

The metal layer is formed of, for example, molybdenum or an alloy containing molybdenum, and reliably prevents the occurrence of hillocks on the region serving substantially as the liquid crystal display portion AR. The metal layer works to decrease the connection resistance to the external unit.

Embodiment 19

Figure 24:
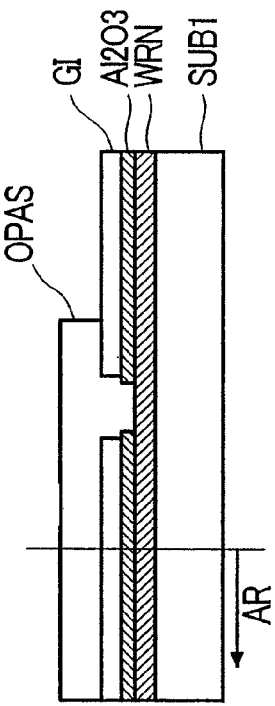
FIG. 24 is a sectional view of the display device according to a nineteenth embodiment of the invention.

FIG. 24 is a view illustrating the constitution of a further embodiment of the liquid crystal display device of the invention, and corresponds to FIG. 23. This embodiment differs from that of FIG. 23 in that the wiring WRN formed of aluminum (Al) or an alloy containing aluminum and constituting the gate signal line GL or the drain signal line DL, is anodically oxidized over the surfaces thereof so as to form an aluminum oxide layer $Al_2O_3$ thereon.

A portion from which the aluminum oxide is removed is existing in the peripheries of the region which substantially serves as the liquid crystal display portion AR. No opening is formed in the inorganic film covering the gate signal line GL or the drain signal line DL and from which the aluminum oxide has been removed. The protection film OPAS is formed on the upper surface of the inorganic film. Hillocks are formed from the gate signal line GL or the drain signal line DL through the portion from which the aluminum oxide is removed and through the inorganic film up to the protection film OPAS, so that the protection film OPAS is not peeled off.

Embodiment 20

Figure 25:
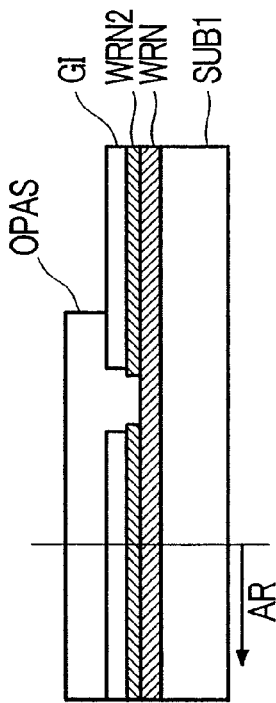
FIG. 25 is a sectional view of the display device according to a twentieth embodiment of the invention.

FIG. 25 is a view illustrating the constitution of a further embodiment of the liquid crystal display device of the invention, and corresponds to FIG. 24. This embodiment differs from that of FIG. 24 in that the opening is formed in the inorganic film, too, in agreement with the portion where there is no aluminum oxide layer $Al_2O_3$ on the wiring WRN which constitutes the gate signal line GL or the drain signal line DL. This allows the hillocks to easily and efficiently grow on the protection film OPAS.

Embodiment 21

Figure 26A:
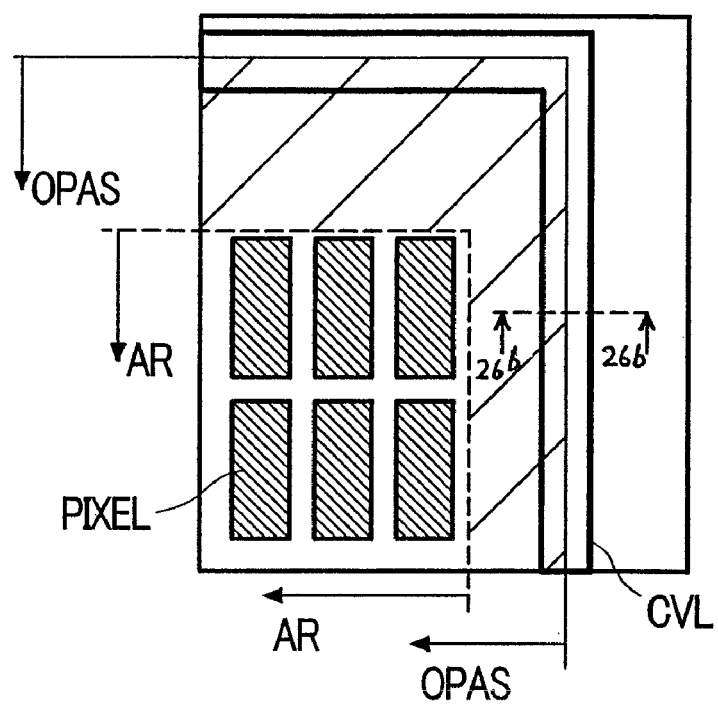
FIG. 26A is a view of the constitution of the display device according to a twenty-first embodiment of the invention.
Figure 26B:
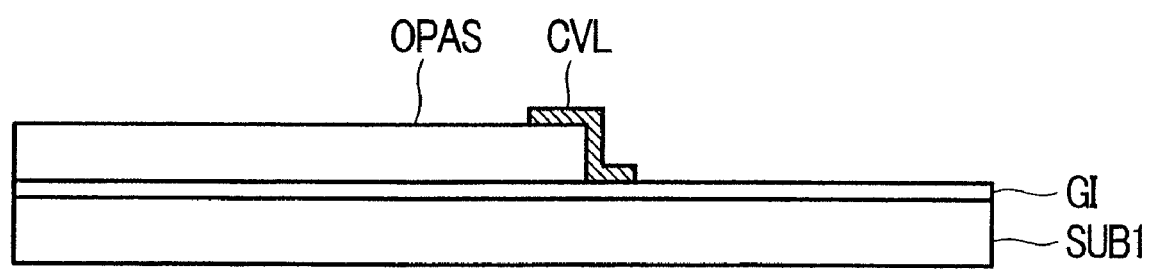
FIG. 26B is a sectional view taken along line 26b-26b in FIG. 26A.

FIG. 26A is a plan view illustrating a further embodiment of the liquid crystal device of the invention. FIG. 26B is a sectional view along the line 26b-26b of FIG. 26A.

FIG. 26A is a plan view showing the right upper corner portion of the liquid crystal display portion AR. A covering layer CVL is formed along the end surfaces of the protection film OPAS to cover the whole circumference thereof. As the covering layer CVL, there may be used any one of the organic film, inorganic film, transparent conducting layer or metal material. Namely, the edges of the protection film OPAS that tend to be easily peeled off, are covered with the covering layer CVL.

Embodiment 22

Figure 27:
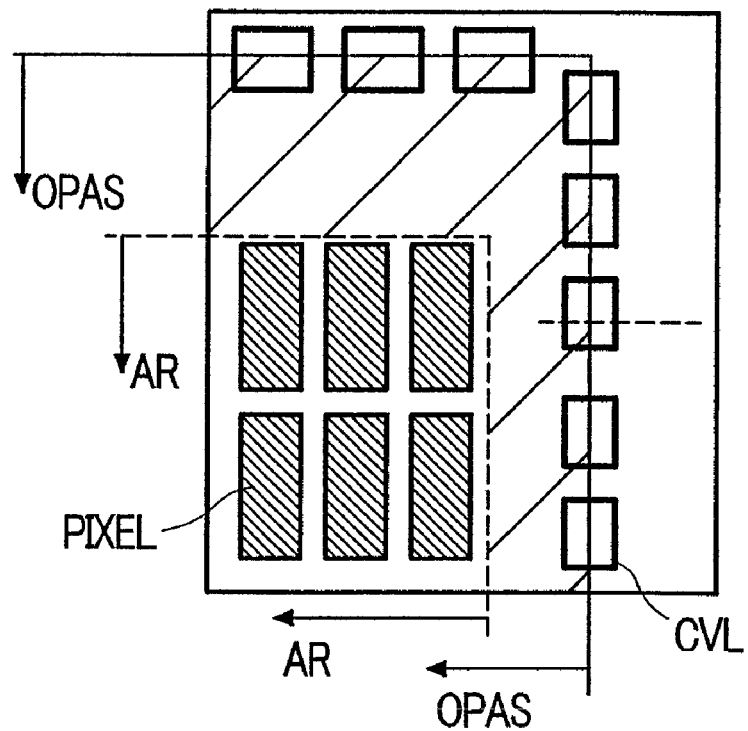
FIG. 27 is a plan view of the display device according to a twenty-second embodiment of the invention.

FIG. 27 is a plan view illustrating a further embodiment of the liquid crystal display device of the invention, and corresponds to FIG. 26(a). This embodiment differs from that of FIG. 26(a) in that the covering layers CVL are discretely formed along the edges of the protection film OPAS. This exhibits the same effect as that of the case of embodiment 21.

Embodiment 23

Figure 28:
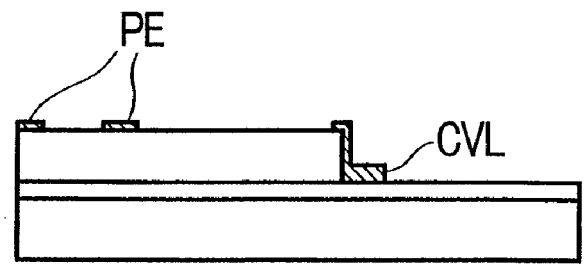
FIG. 28 is a sectional view of the display device according to a twenty-third embodiment of the invention.

FIG. 28 is a plan view illustrating a further embodiment of the liquid crystal display device of the invention, and corresponds to FIG. 26B. This embodiment differs from that of FIG. 26B in that an electrically conducting layer is used as the covering layer CVL for covering the edges of the protection film OPAS. In this case, it is desired that the electrically conducting layer is formed simultaneously with the formation of the electrodes PE such as counter electrode. This does not cause an increase in the number of the production steps, and protects the side wall surfaces at the edges of the protection film OPAS from coming in contact with the developing solution, washing solution, etching solution or resist-peeling solution used for patterning the electrodes.

Figure 29A:
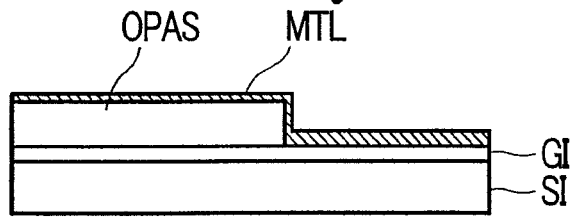
FIG. 29A to FIG. 29E are plan views of a method of producing the display device according to the twenty-third embodiment of the invention.
Figure 29B:
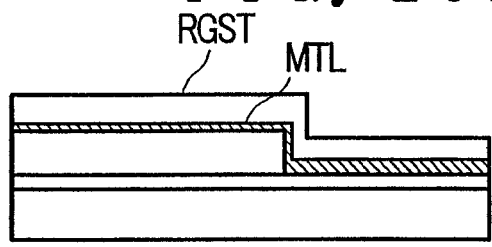
Figure 29C:
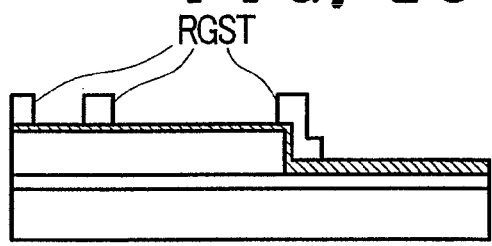
Figure 29D:
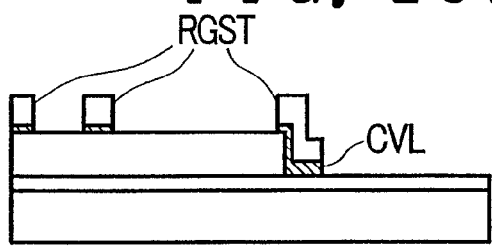
Figure 29E:
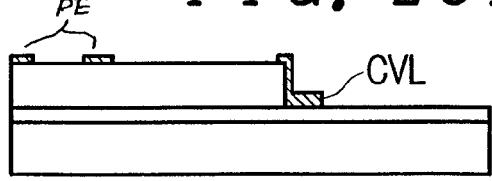

FIGS. 29A to 29E are diagrams of steps illustrating an embodiment of forming the electrically conducting layer simultaneously with the formation of the electrodes PE. In FIG. 29A, an electrode layer MTL that becomes the electrode is formed on the organic protection film OPAS and on the inorganic insulating film GI and in FIG. 29B, a resist RGST is formed thereon. In the step of patterning the resist shown in FIG. 29C, the end surfaces of the protection film OPAS are protected from the resist-developing solution by the resist RGST and by the electrode layer. In the step of etching the electrode layer shown in FIG. 29D, the end surfaces of the protection film OPAS are protected from the etching solution by the resist and by the electrode layer. In the step of peeling the resist shown in FIG. 29E, the end surfaces of the protection film OPAS are protected from the resist-peeling solution by the electrode layer CVL.

Embodiment 24

Figure 30:
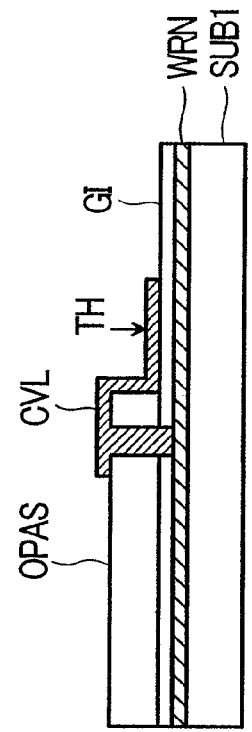
FIG. 30 is a sectional view of the display device according to a twenty-fourth embodiment of the invention.
Figure 31:
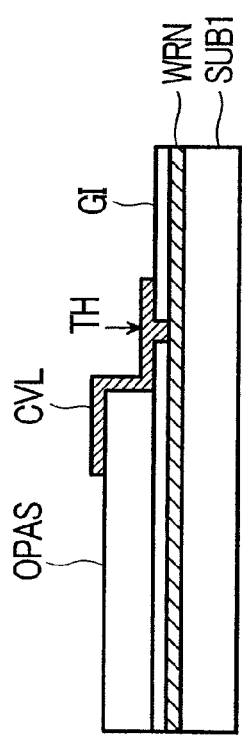
FIG. 31 is another sectional view of the display device according to the twenty-fourth embodiment of the invention.

FIG. 30 is a sectional view illustrating a further embodiment of the liquid crystal display device of the invention, and corresponds to FIG. 28. This embodiment differs from that of FIG. 28 in that the electrically conducting material CVL covering the end surfaces of the protection film OPAS is electrically connected to the signal line WRN (gate signal line GL or the drain signal line DL) formed under the inorganic film GI to thereby constitute a terminal. This terminal can be used as the terminal TT for conducting the checking. In FIG. 30, the terminal is connected to the signal line using the through-hole formed in the inorganic film. As shown in FIG. 31, however, they may be connected together using the through-hole formed penetrating through the protection film OPAS and the inorganic film, as a matter of course.

Embodiment 25

Figure 32:
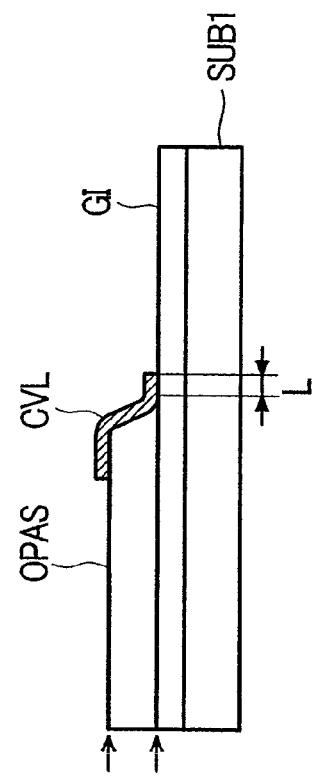
FIG. 32 is a sectional view of the display device according to a twenty-fifth embodiment of the invention.

FIG. 32 is a sectional view illustrating a further embodiment of the liquid crystal display device of the invention, and corresponds to FIG. 26B. This embodiment differs from that of FIG. 26B in that the angle θ of the end surface of the protection film OPAS with respect to the surface of the transparent substrate SUB1 is set over a range of from 10° to 80°. When the angle is greater than 80°, the protection film OPAS is not formed to a sufficient degree and the wiring tends to become broken. When the angle is smaller than 10°, on the other hand, the distance becomes too great between the upper side and the lower side in the sectional structure of the protection film OPAS, and the end surfaces of the protection film OPAS tend to be ripped off. When the covering layer CVL is formed to also work as a checking electrode, it is desired that the angle θ of the end surface of the protection film OPAS relative to the surface of the transparent substrate SUB1 is in a range of from 10° to 70°. This is such that the probe can be brought into contact therewith at the time of checking.

Figure 33:
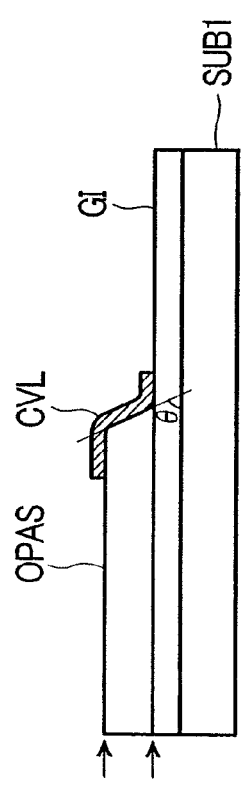
FIG. 33 is another sectional view of the display device according to the twenty-fifth embodiment of the invention.

Referring further to FIG. 33, it is desired that the covering layer CVL protrudes beyond the lower edge of the protection film OPAS by an amount L which is not smaller than 10 μm. This is to prevent the lower edge of the protection film OPAS from floating.

Embodiment 26

Figure 34A:
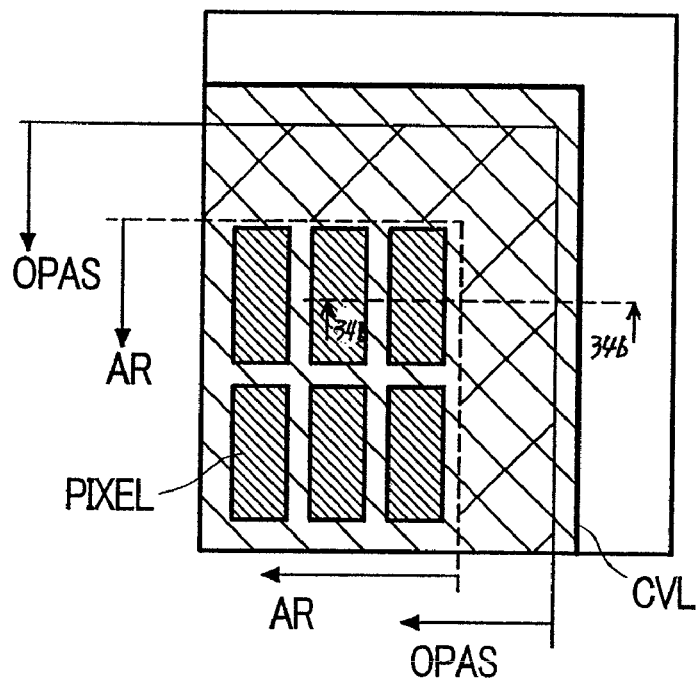
FIG. 34A is a plan view of the constitution of the display device according to a twenty-sixth embodiment of the invention.
Figure 34B:
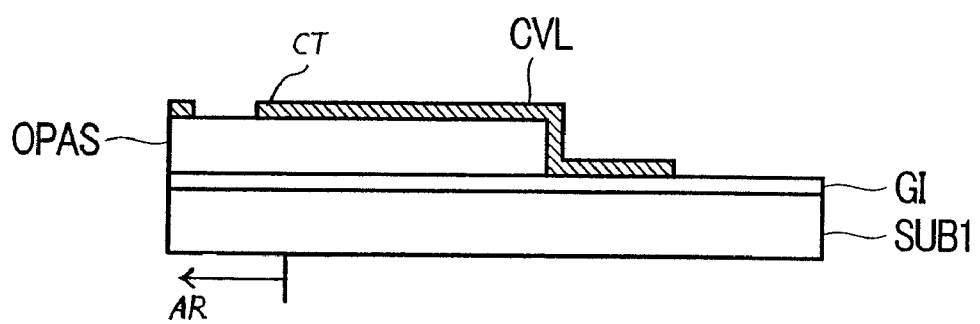
FIG. 34B is a sectional view taken along line 34b-34b in FIG. 34A.

FIG. 34A is a plan view illustrating a further embodiment of the liquid crystal device of the invention, and FIG. 34B is a sectional view along the line 34b-34b of FIG. 34A. FIG. 34A is a plan view showing the right upper corner portion of the liquid crystal display portion AR. The constitution of the pixels is nearly the same as the one shown in FIG. 1 (in this case, the drain signal lines DL, pixel electrodes PX and counter electrodes CT may be straight), and the counter electrodes CT are formed on the upper surface of the protection film OPAS.

The covering layer CVL covering the end surfaces of the protection film OPAS permits the counter electrode CT to extend. In this case, the area of the covering layer CVL covering the protection film OPAS greatly increases to nearly completely prevent the peeling of the protection film OPAS. The covering layer CVL also works as the counter voltage signal line CL for supplying the voltage to the counter electrodes CT, and makes it possible to greatly decrease the electric resistance.

When a dummy liquid crystal display portion DAR or the like is formed close to the region which substantially works as the liquid crystal display portion AR, the electrodes formed on the protection film OPAS of the pixel regions in the dummy liquid crystal display portion DAR may be extended so as to form the covering layer CVL, as a matter of course.

Embodiment 27

FIGS. 35 to 38 are views illustrating patterns of the covering layer CVL covering the edges of the protection film OPAS.

Figure 35:
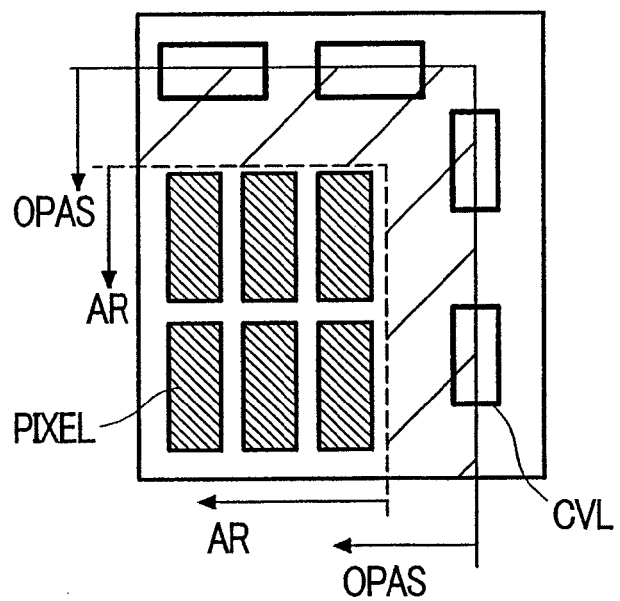
FIG. 35 is a plan view of the display device according to a twenty-seventh embodiment of the invention.
Figure 36:
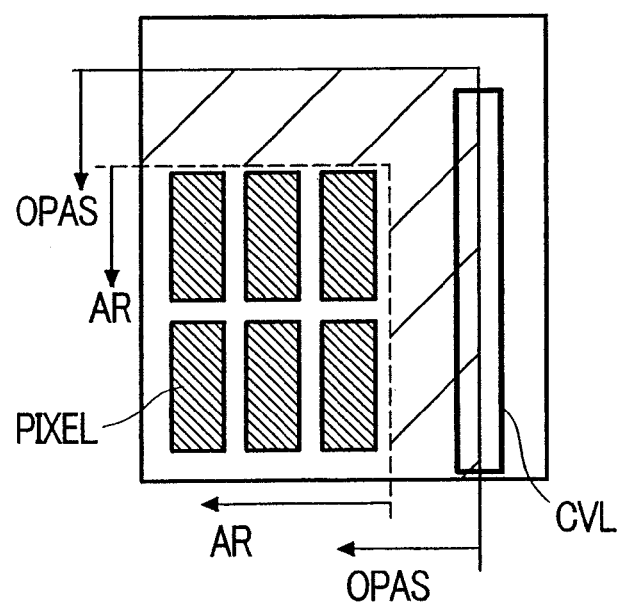
FIG. 36 is another plan view of the display device according to the twenty-seventh embodiment of the invention.
Figure 37:
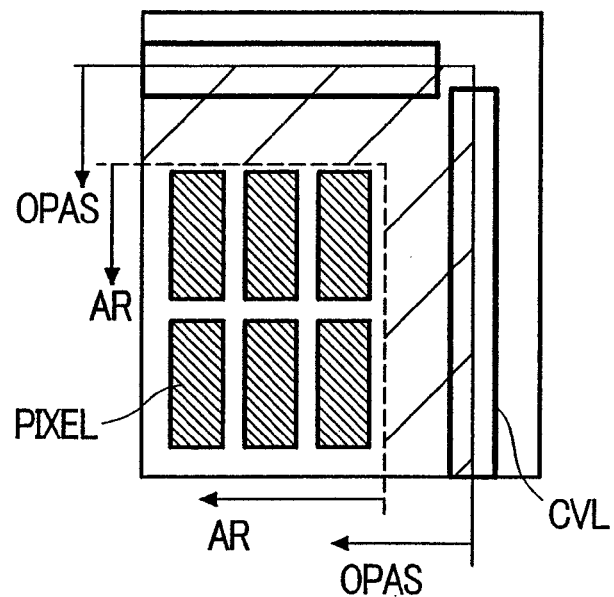
FIG. 37 is a further plan view of the display device according to the twenty-seventh embodiment of the invention.
Figure 38:
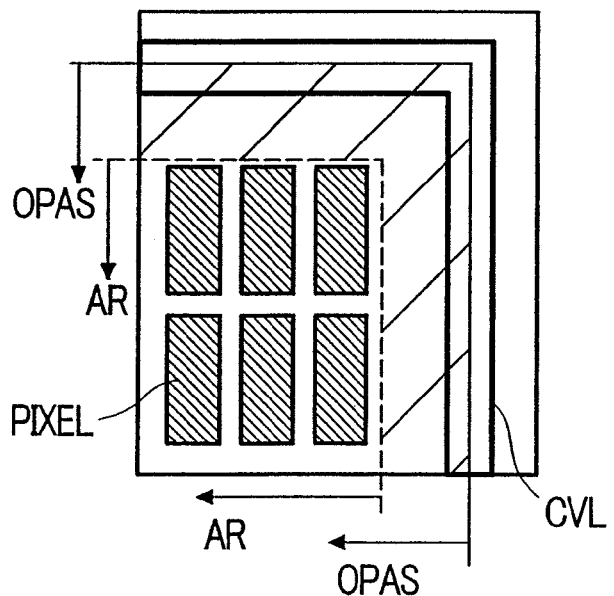
FIG. 38 is a further plan view of the display device according to the twenty-seventh embodiment of the invention.

FIG. 35 shows the covering layers being discretely formed along the edges of the protection film OPAS, FIG. 36 shows the covering layer formed along the edge which is in parallel with the y-direction among the edges of the protection film OPAS, FIG. 37 shows the covering layers being independently formed along the edge in parallel with the x-direction and along the edge in parallel with the y-direction of the protection film OPAS, and FIG. 38 shows the covering layer continuously formed along the edge in parallel with the x-direction and along the edge in parallel with the y-direction of the protection film OPAS. Here, it needs not be pointed out that the patterns of the covering layers CVL covering the edges of the protection film OPAS are not limited to only those described above.

Embodiment 28

Figure 39A:
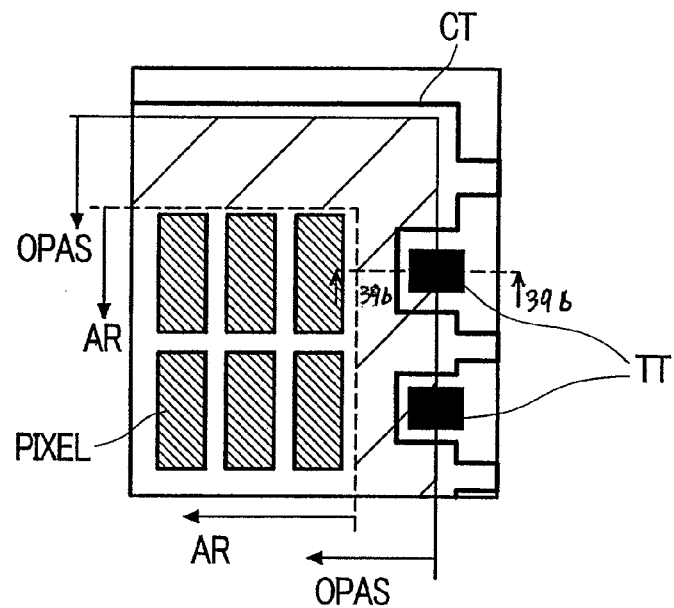
FIG. 39A is a plan view of the constitution of the display device according to a twenty-eighth embodiment of the invention.
Figure 39B:
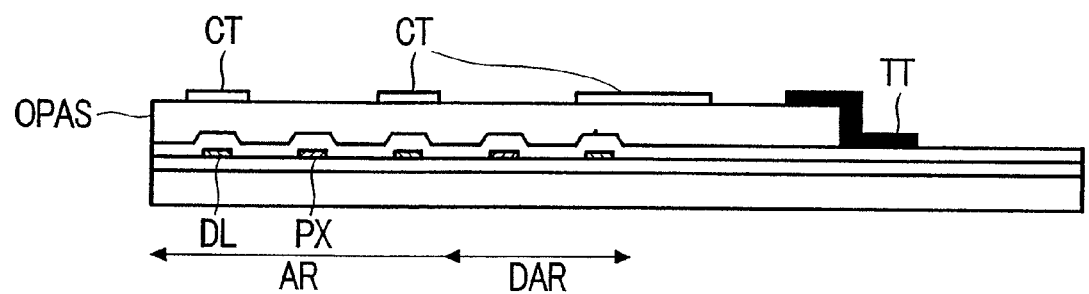
FIG. 39B is a sectional view taken along line 39b-39b in FIG. 39A.

FIG. 39A and FIG. 39B are views illustrating the constitution of a further embodiment of the liquid crystal display device of the invention, and corresponds to FIG. 34A and FIG. 34B. This embodiment differs from that of FIG. 34 in that the edges of the protection film OPAS are covered by the extended portion of the counter electrode CT (playing the role of the covering layer CVL) formed on the upper surface of the protection film OPAS and by the terminal TT for checking. That is, in the region where the terminal TT for checking is formed, the extending portion of the counter electrode CT avoids the above region and covers the edge of the protection film OPAS in the regions other than the above avoided region.

Figure 40:
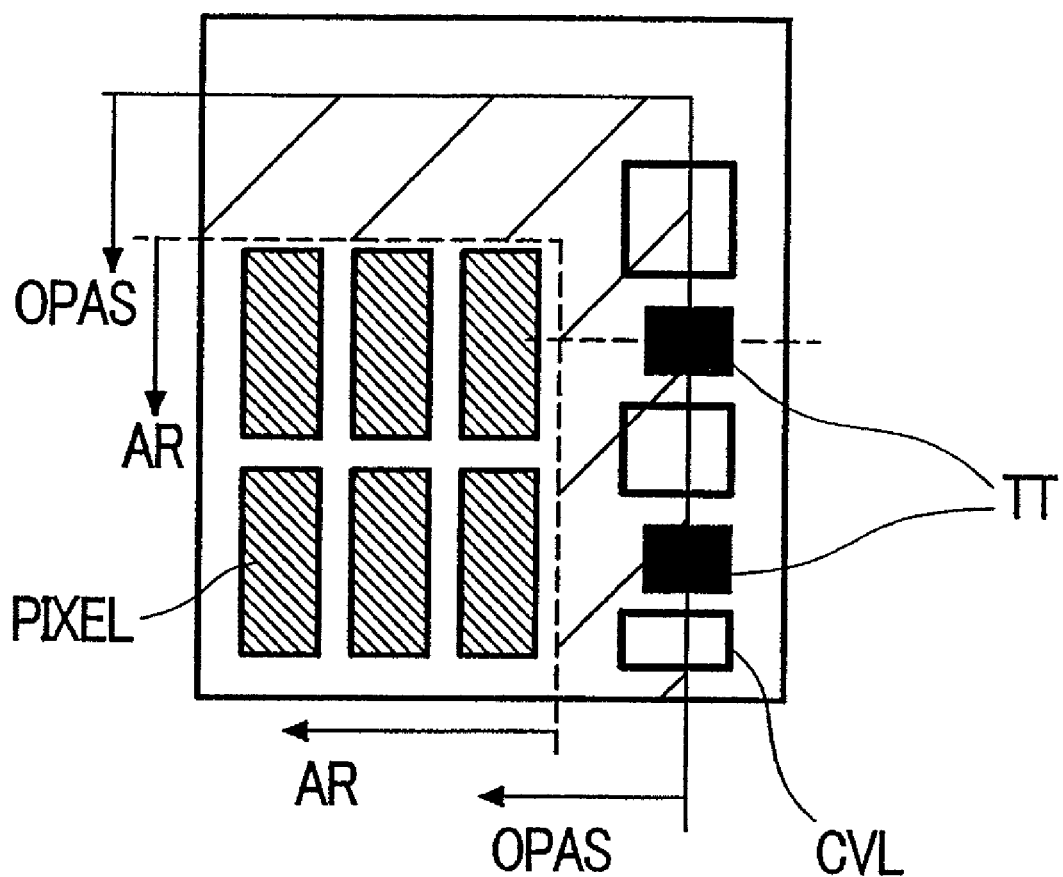
FIG. 40 is another plan view of the display device according to the twenty-eighth embodiment of the invention.

This constitution is in no way limited to the one in which the electrodes are formed on the upper surface of the protection film OPAS, but may be such that as shown in FIG. 40, the edges of the protection film OPAS are covered with the terminals TT for checking, such as separate materials CVL which are alternately arranged.

Embodiment 29

Figure 41A:
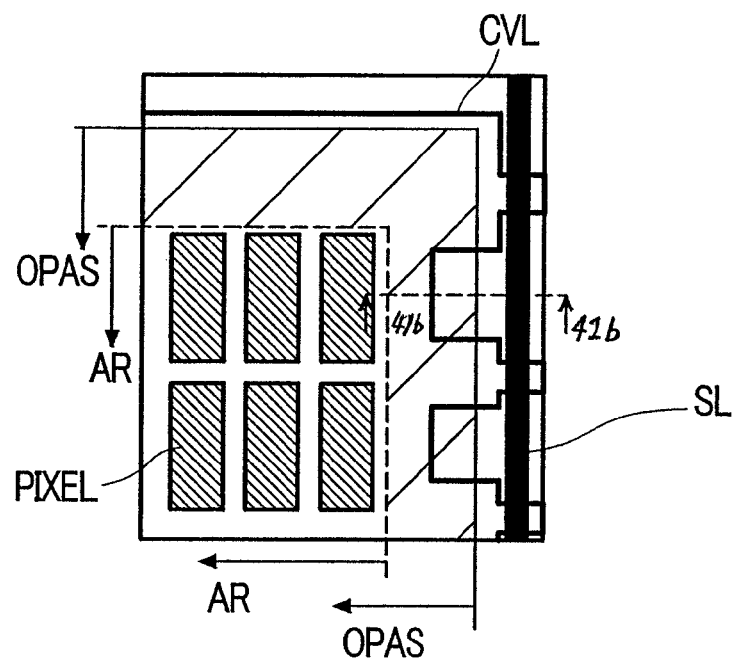
FIG. 41A is a plan view of the constitution of the display device according to a twenty-ninth embodiment of the invention.
Figure 41B:
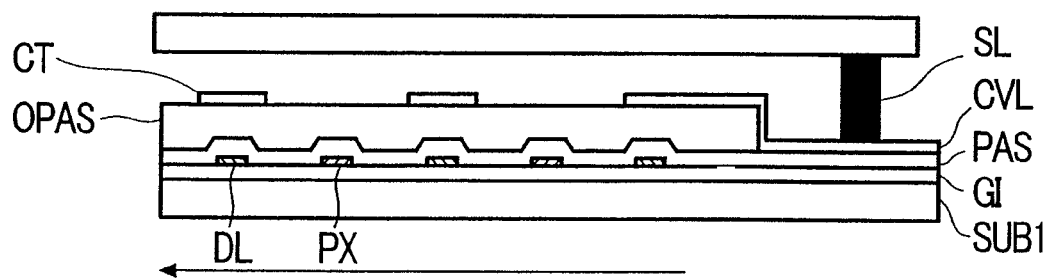
FIG. 41B is a sectional view taken along line 41b-41b in FIG. 41A.

FIG. 41A is a view illustrating the constitution of a further embodiment of the liquid crystal display device of the invention, and corresponds to FIG. 39A. FIG. 41B is a sectional view including a pair of substrates of this embodiment. This embodiment differs from that of FIG. 39 in that a portion is clarified for forming a sealing member SL. The sealing member SL is formed being overlapped on the covering layer CVL which is extending from the edge of the protection film OPAS to the edge of the transparent substrate SUB1.

Figure 42:
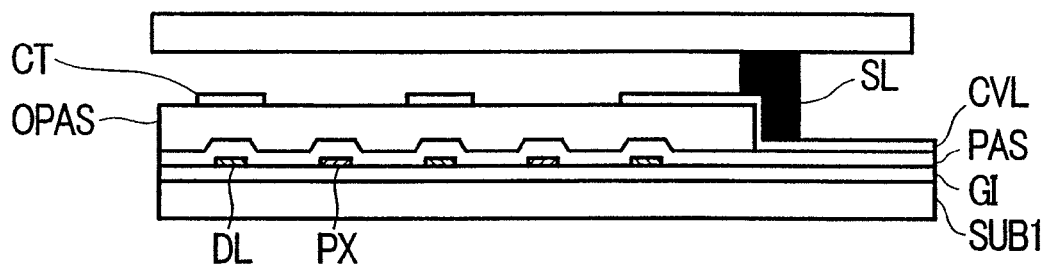
FIG. 42 is another sectional view of the display device according to the twenty-ninth embodiment of the invention.

The covering layer CVL is prevented by the sealing member SL from being peeled off, which, then, makes it possible to reliably prevent the protection film OPAS from being peeled off. In particular, the resistance against vibration and shock is improved after the device is completed as a product. From the same point of view, the same effect is exhibited even when the sealing member SL is formed along the edges of the protection film OPAS as shown in, for example, FIG. 42.

Embodiment 30

The above-mentioned embodiments have dealt with the liquid crystal display devices. In the organic EL display device, ton, however, the gate signal lines and drain signal lines are formed on the surface of the substrate in the same pattern as the one described above. Besides, the organic material layer is formed on nearly the whole display surface. It, therefore, needs not be pointed out that the invention can further be adapted to any other display devices that include the organic EL display device.

The constitution of the organic EL display device will now be schematically described.

Figure 43A:
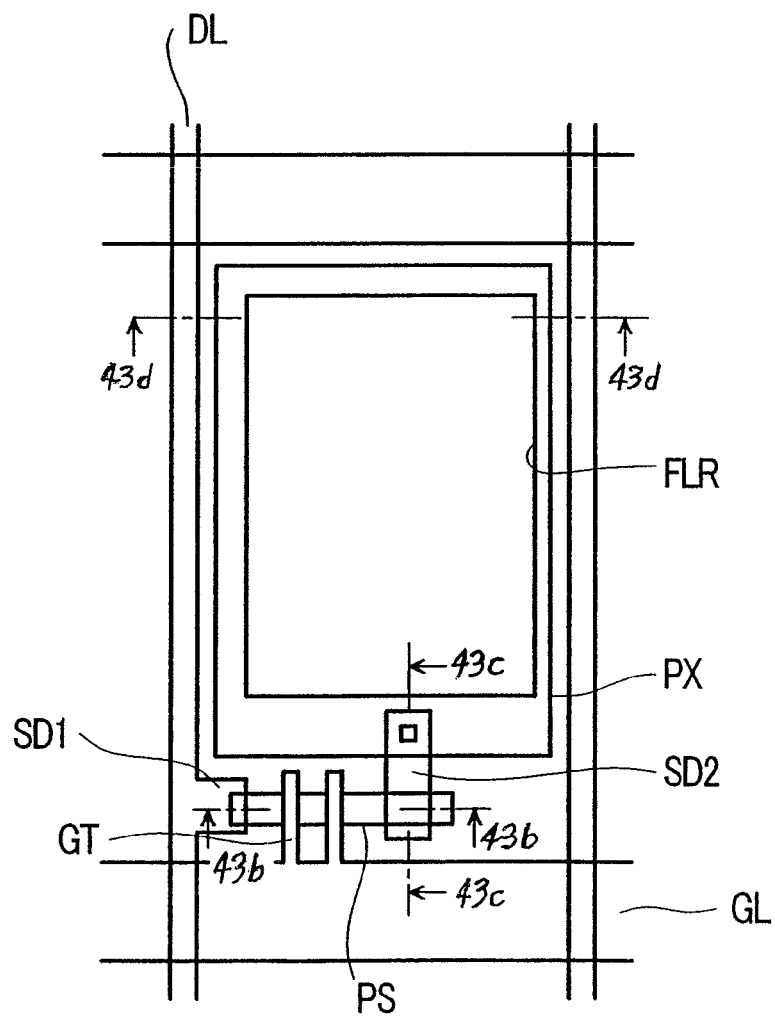
FIG. 43A is a plan view of the display device according to a thirtieth embodiment of the invention.
Figure 43B:
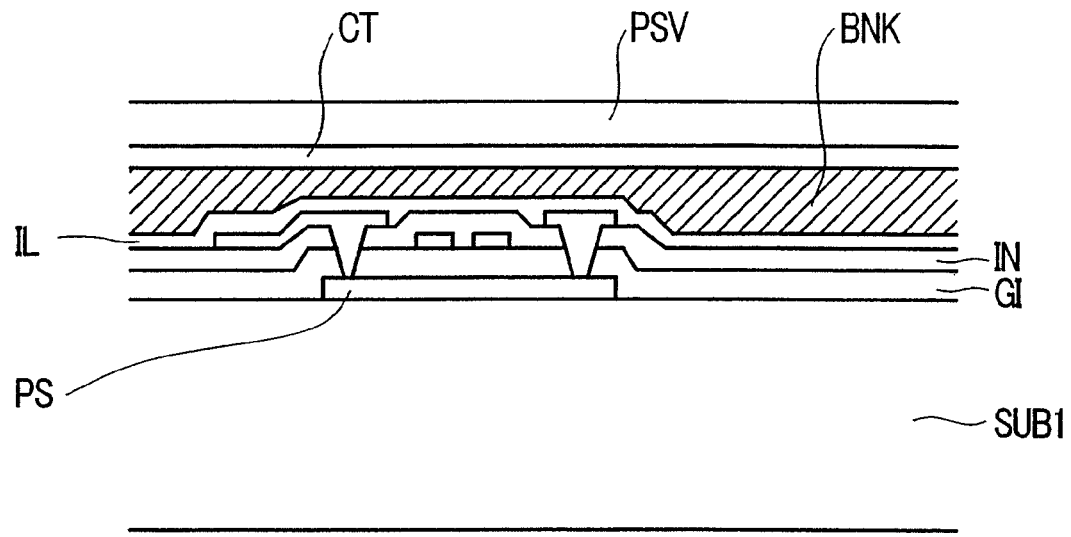
FIG. 43B is a sectional view taken along line 43b-43b in FIG. 43A.
Figure 43C:
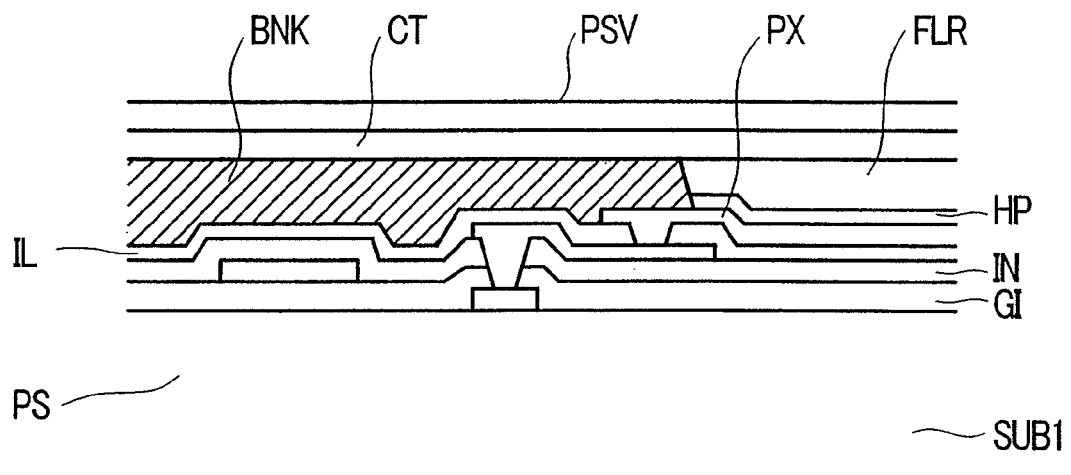
FIG. 43C is a sectional view taken along line 43c-43c in FIG. 43A.
Figure 43D:
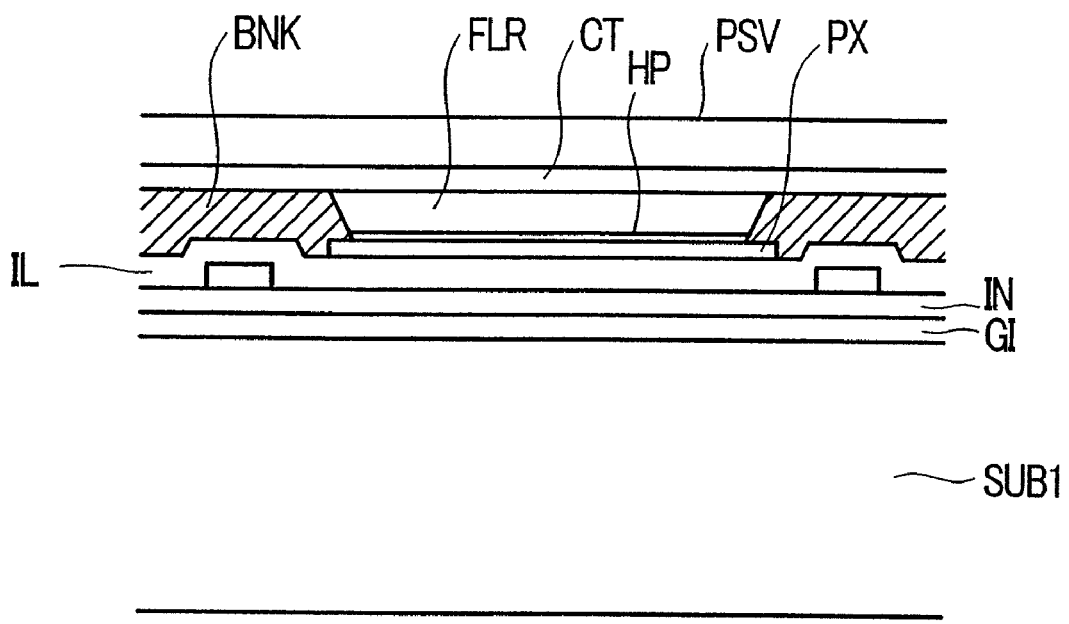
FIG. 43D is a sectional view taken along line 43d-43d in FIG. 43A.

FIG. 43A is a plan view illustrating an embodiment of the organic EL display device, FIG. 43B is a sectional view along the line 43b-43b of FIG. 43A, FIG. 43C is a sectional view along the line 43c-43c of FIG. 43A, and FIG. 43d is a sectional view along the line 43d-43d of FIG. 43A.

In these drawings, a semiconductor layer PS of a polysilicon layer extending in the x-direction is formed in, for example, a left lower portion of each pixel region on the surface of the substrate SUB. The semiconductor layer PS also serves as a semiconductor layer of the thin-film transistors TFT.

An insulating film GI is formed on the surface of the substrate SUB covering the semiconductor layer PS. The insulating film GI serves as a gate-insulating film in the region where the thin-film transistors TFT are formed. On the surface of the insulating film GI, there are formed gate signal lines GL which are extending in the x-direction and are arranged in parallel in the y-direction. The gate signal lines GL define the pixel regions together with the drain signal lines DL that will be described later. The gate signal line GL has a portion that is extending traversing nearly the central portion of the semiconductor layer PS, and the extending portion works as a gate electrode GT of the thin-film transistor TFT.

After the gate electrode GT has been formed, impurity ions are injected with the gate electrode GT as a mask, and the semiconductor layer PS assumes a decreased resistance in the regions except the region just under the gate electrode GT. An insulating film IN is formed on the surface of the substrate SUB covering the gate signal line GL (gate electrode GT). The insulating film IN works as an interlayer insulating film for the gate signal lines GL in the region where there are formed the drain signal lines DL that will be described later. On the surface of the insulating film IN, there are formed drain signal lines DL that are extending in the y-direction and are arranged in parallel in the x-direction. The drain signal lines DL have portions that are extending up to an end of the semiconductor layer PS, and are connected to the semiconductor layer PS via through-holes that have been formed in advance penetrating through the insulating film IN and the insulating film GI. Namely, the extending portions of the drain signal lines DL work as drain electrodes SD1 of the thin-film transistors TFT. The source electrode SD2 is connected to the other end of the semiconductor layer PS via the through-hole that has been formed in advance penetrating through the insulating film IN and the insulating film GI, the source electrode SD2 having an extending portion for connection to the pixel electrode PX that will be described later.

An insulating film IL is formed on the surface of the substrate SUB on which are formed the drain signal lines DL (drain electrodes SD1) and the source electrodes SD2. On the upper surface of the insulating film IL, there is formed a pixel electrode PX on the center of each pixel region except small peripheral portions. The pixel electrode PX is connected to the source electrode SD2 of the thin-film transistor TFT via the through-hole formed in the insulating film IL.

A light-emitting material layer FLR is formed on the upper surface of the pixel electrode PX via a hole injection layer HP. The light-emitting material layer FLR is divided from the light-emitting material layer of other neighboring pixel regions via a bank film BNK which comprises an organic material layer. The bank film is one of organic film which constitutes each of pixel regions.

A counter electrode CT is formed on the upper surfaces of the light-emitting material layer FLR and of the bank film BNK in common for the pixel regions, and a protection film PSV is formed on the upper surface of the counter electrode CT. An electric current flows into the light-emitting material layer FLR interposed between the pixel electrode PX and the counter electrode CT, whereby the light-emitting material layer FLR emits light. By forming at least either one of the pixel electrode PX or the counter electrode CT by using a light-transmitting electrically conducting material such as ITO, IZO or ITZO, the light can be seen by eyes.

The thus constituted organic EL display device uses an organic material layer in the display portion and has an electrically conducting film formed on the upper surface thereof. Therefore, the organic EL display device is placed under the same circumstances as the liquid crystal display device described above, and has the same problem.

Therefore, the above-mentioned embodiments can be adapted to the organic EL display device, because organic EL display device includes organic films such as protection film PSV and bank film BNK.

According to the display device of this invention as will be obvious from the foregoing description, it is possible to prevent the organic material layer from being peeled off.

What is claimed is:

1. A display device comprising:
   a plurality of signal lines extending in parallel to one another and having portions extending in a first direction and in a second direction, a plurality of gate signal lines extending in parallel to one another and extending in a third direction, and a plurality of pixels, each pixel being delimited by an adjacent pair of signal lines having the portions extending in the first and second directions and an adjacent pair of gate signal lines extending in the third direction;
   a display signal line of the plurality of signal lines being connected to a display pixel electrode of a display pixel of the plurality of pixels via a TFT;
   a first dummy signal line of the plurality of signal lines having a bend which is disposed between an adjacent pair of gate signal lines, the first dummy signal line being connected to a dummy pixel electrode of a first dummy pixel via a TFT; and
   a second dummy signal line of the plurality of signal lines being disposed adjacent to the first dummy pixel;
   wherein the second dummy signal line is not connected to any dummy pixel electrode.

2. The display device according to claim 1, wherein the second dummy signal line has a bend disposed between the adjacent pair of gate signal lines.

3. The display device according to claim 1, wherein a semiconductor layer is not arranged at the second dummy signal line.

4. The display device according to claim 2, wherein a semiconductor layer is not arranged at the second dummy signal line.

5. The display device according to claim 1, wherein the first, second and third directions differ from one another.

6. The display device according to claim 1, wherein the portions of the signal lines extending in the first and second directions extend transversely to the third direction of the gate signal lines.

7. The display device according to claim 1, wherein the bend of the first dummy signal is at a position where the portions extending in the first and second directions intersect.

8. The display device according to claim 1, wherein the display signal line has a bend disposed between the adjacent pair of the gate signal lines.

* * * * *